United States Patent
Abe

(10) Patent No.: US 7,501,300 B2
(45) Date of Patent: Mar. 10, 2009

(54) MANUFACTURING METHOD OF SEMICONDUCTOR INTEGRATED CIRCUIT DEVICE

(75) Inventor: Yoshiyuki Abe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 280 days.

(21) Appl. No.: 11/476,721

(22) Filed: Jun. 29, 2006

(65) Prior Publication Data

US 2007/0004180 A1    Jan. 4, 2007

(30) Foreign Application Priority Data

Jun. 29, 2005    (JP) .............................. 2005-190444

(51) Int. Cl.
*H01L 21/00* (2006.01)
(52) U.S. Cl. .................. 438/46; 438/460; 438/464; 438/756; 257/E25.001
(58) Field of Classification Search ............... 438/460, 438/438, 464; 257/E25.001
See application file for complete search history.

(56) References Cited

U.S. PATENT DOCUMENTS

| | | | |
|---|---|---|---|
| 6,305,230 B1 | 10/2001 | Kasukabe et al. | |
| 6,491,836 B1 * | 12/2002 | Kato et al. | 216/88 |
| 2004/0241962 A1 * | 12/2004 | Nagai | 438/460 |
| 2005/0142815 A1 * | 6/2005 | Miyazaki et al. | 438/464 |

FOREIGN PATENT DOCUMENTS

| | | |
|---|---|---|
| JP | 7-283280 | 10/1995 |
| JP | 8-50146 | 2/1996 |
| JP | 8-201427 | 8/1996 |
| JP | 10-308423 | 11/1998 |
| JP | 11-23615 | 1/1999 |
| JP | 11-97471 | 4/1999 |
| JP | 2000-150594 | 5/2000 |
| JP | 2001-159643 | 6/2001 |

* cited by examiner

*Primary Examiner*—Walter L Lindsay, Jr.
*Assistant Examiner*—Abdulfattah Mustapha
(74) *Attorney, Agent, or Firm*—Antonelli, Terry, Stout & Kraus, LLP.

(57) ABSTRACT

The technology in which lowering of the manufacturing yield of the semiconductor products resulting from contamination impurities can be suppressed is offered. When reducing the thickness of a semiconductor wafer, so that a crushing layer which is relatively thin and has gettering function of, for example, less than 0.5 ☐m, less than 0.3 ☐m or less than 0.1 ☐m in thickness may be formed at the back surface, and the die strength after making the semiconductor wafer into chips by dividing or almost dividing may be secured, the back surface of the semiconductor wafer is ground by the diamond wheel which held the diamond abrasive of, for example, fineness number #5000 to #20000 with vitrified cement B1 which has countless bubbles and impregnated synthetic-resin B2 which has viscosity in the countless bubbles.

22 Claims, 15 Drawing Sheets

FIG. 2
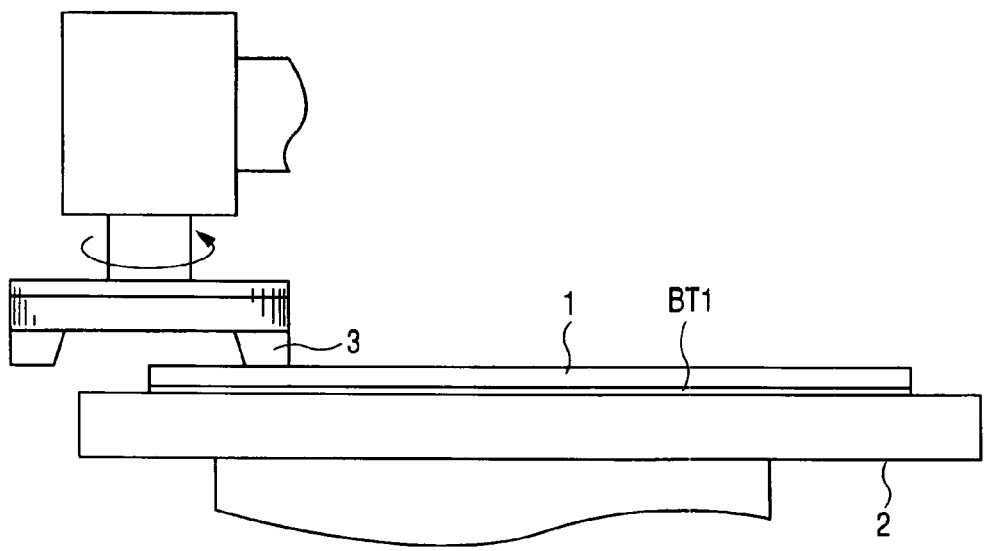
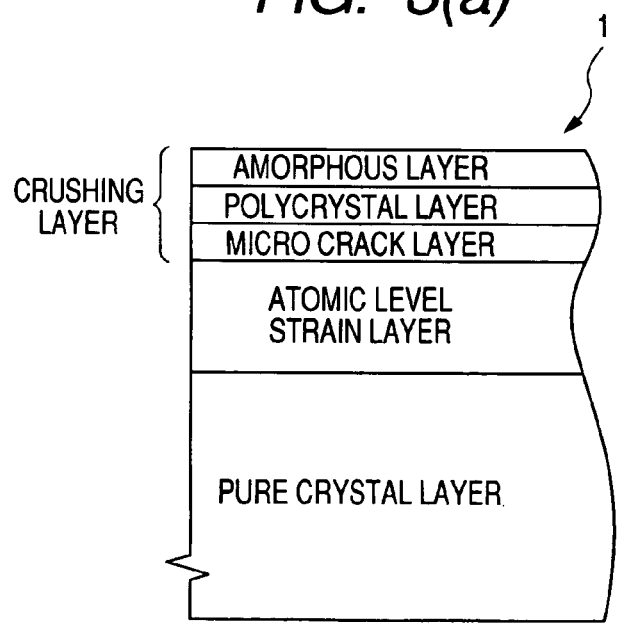
FIG. 3(a)
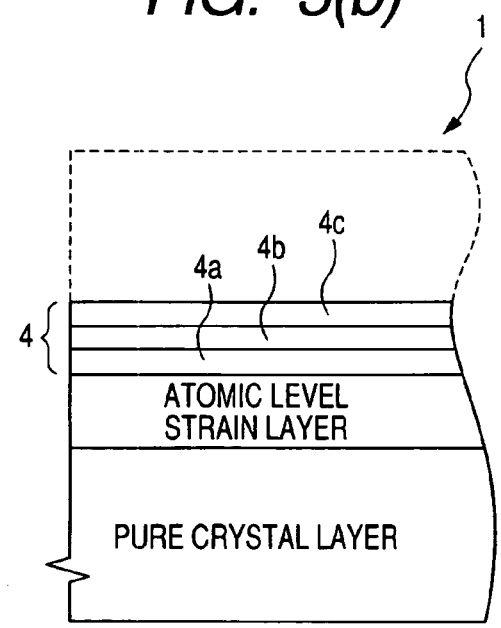
FIG. 3(b)

MANUFACTURING METHOD OF SEMICONDUCTOR INTEGRATED CIRCUIT DEVICE

CROSS-REFERENCE TO RELATED APPLICATION

The present application claims priority from Japanese patent application No. 2005-190444 filed on Jun. 29, 2005, the content of which is hereby incorporated by reference into this application.

1. Field of the Invention

The present invention relates to a manufacturing technology of a semiconductor integrated circuit device, and particularly relates to an effective technology in the application to manufacture of the semiconductor integrated circuit device to dicing which dices a semiconductor wafer into an each chip and further die bonding in which a chip is picked up and mounted on a substrate from a back-grinding which grinds a back surface of the semiconductor wafer after formation of a circuit pattern is mostly completed on the semiconductor wafer.

2. Description of the Background Art

In Japanese Unexamined Patent Publication No. 2004-142085, for example, a grinding wheel suitable for gear honing which has a grinding wheel composition consisting of an abrasive particle of sol gel alumina nature, or other abrasive particles with the abrasive particle of sol gel alumina nature, vitrified binder and a pore, with which hardening resin is contained in the pore, and whose Rockwell hardness is 50 or more is disclosed (for example, refer to Patent Reference 1.).

In Japanese Unexamined Patent Publication No. 2000-135683, the compound grinding wheel whose grinding surface is formed by a vitrified grindstone part, and the resinoid grindstone part formed so that the surroundings of the vitrified grindstone part might be buried, and whose resinoid grindstone part is the porosity which has pores of a large number by bubbles, and its manufacturing method are disclosed (for example, refer to Patent Reference 2).

[Patent Reference 1] Japanese Unexamined Patent Publication No. 2004-142085 (paragraph [0009])

[Patent Reference 2] Japanese Unexamined Patent Publication No. 2000-135683 (paragraph [0006], [0008], [0015], FIG. 1)

SUMMARY OF THE INVENTION

The manufacturing process to die bonding which makes the back-grinding of the semiconductor wafer, individually separates this semiconductor wafer to respective chips by dicing, and mounts the chip individually separated on a substrate advances as the following.

First, after sticking an adhesive tape on the circuit formation surface of a semiconductor wafer, a grinder apparatus is equipped with the semiconductor wafer and thickness of the semiconductor wafer is made thin to predetermined thickness by grinding the back surface of the semiconductor wafer, pressing the rotating abrasive (back-grinding step). Then, the back surface of the semiconductor wafer is stuck on a dicing tape fixed to a ring shape frame with a wafer mounting device, and the adhesive tape is peeled from the circuit formation surface of the semiconductor wafer (wafer mounting step).

Next, the semiconductor wafer is cut by a predetermined scribe-line, and the semiconductor wafer is individually separated to respective chips (dicing step). As for the chip individually separated, the back surface is pushed and pressed by a pushing-up pin via the dicing tape, and, hereby, chips are peeled from the dicing tape. A collet is located in the upper part which faces with the pushing-up pin, and the peeled chip is adsorbed with the collet and held (picking-up step). Then, the chip held at the collet is transported to a substrate, and is joined to the predetermined location on the substrate (die-bonding step).

By the way, while miniaturization and thinning of an electrical and electric equipment progress, the thinning of the chip mounted in it is demanded. The laminated type semiconductor integrated circuit device which laminates a plurality of chips and is mounted in one package in recent years is developed, and the request to the thinning of the chip is increasing more and more. For this reason, at the back-grinding step, grinding which makes thickness of a semiconductor wafer, for example in less than 100 μm is performed. The back surface of the ground semiconductor wafer includes an amorphous layer/a polycrystal layer/a micro crack layer/an atomic level strain layer (stress gradual shift layer)/a pure crystal layer, among these an amorphous layer/a polycrystal layer/micro crack layer is a crushing layer (or crystal defect layer). The thickness of this crushing layer is about 1-2 μm, for example.

When the above-mentioned crushing layer is in the back surface of the semiconductor wafer, the problem that the die strength (internal stress value generated inside a chip when a simple-bending stress is applied to the chip, and the chip breaks) of the chip which is individually separated from the semiconductor wafer falls will happen. Lowering of this die strength appears notably in the chip of less than 100 μm in thickness. Then, lowering of the die strength of the chip is prevented by making the back surface of the semiconductor wafer into a specular surface, removing the crushing layer, performing a stress relief following the back-grinding. In a stress relief, for removal of the crushing layer (in connection with it, an atomic level strain layer occurs in an interface with a pure crystal layer) generated unavoidably by grinding by the abrasive which has fixed abrasive, grinding or polishing of a fixed abrasive system, i.e., dry-polishing method, grinding or polishing of a non-fixed abrasive system, i.e., a CMP (Chemical Mechanical Polishing) method, a polishing method by the floating abrasive particle and a polishing pad (a floating abrasive particle is not used in a dry-polishing method), and a wet etching method by a chemical, etc. are applied.

However, when the crushing layer of the back surface of the semiconductor wafer is removed, the contamination impurities adhering to the back surface of the semiconductor wafer, for example, heavy metal impurities, such as copper (Cu), iron (Fe), nickel (Ni), or chromium (Cr), will permeate into the semiconductor wafer easily. Contamination impurities are mixed in all semiconductor manufacturing devices, such as gas piping and heater wires, and process gas can also serve as a pollution source of contamination impurities. The contamination impurities which permeated from the back surface of the semiconductor wafer diffuse the inside of the semiconductor wafer further, and are drawn near the crystal defect near the circuit formation surface. The contamination impurities diffused to near the circuit formation surface form the trapping level of a carrier into a forbidden band, for example and the contamination impurities dissoved as solid to the silicon oxide/silicon interface make an interface state increase, for example. As a result, the characteristic defect of the semiconductor element resulting from contamination impurities occurs, and lowering of the manufacturing yield of semiconductor products is brought about. For example, in the flash memory which is a semiconductor nonvolatile memory, a bad sector at the time of Erase/Write resulting from contamination impurities increases, and characteristic defect occurs, with the number of relief sectors being lacking. In general DRAM (Dynamic Random Access Memory) and pseudo-SRAM (Static Random Access Memory), a leak system defect, such as degradation of Refresh characteristics and Self Refresh characteristics resulting from contamination impurities, occurs. Data retention defect occurs in the memory of a flash system.

That is, although the die strength of a chip is securable with the stress relief after a back-grinding, since a crushing layer is lost in this stress relief, the gettering effect over invasion of the contamination impurities from the back surface of a semiconductor wafer falls. When diffusion of contamination impurities goes to near a circuit formation surface, the characteristics of a semiconductor element may be changed and it may become a malfunction. When the crushing layer is left in the back surface of the semiconductor wafer, infiltration of the contamination impurities which adhered to the back surface of the semiconductor wafer can be stopped by this crushing layer, but lowering of the die strength of the chip cannot be prevented.

One purpose of one invention disclosed by this embodiment is to offer the technology in which lowering of the manufacturing yield of the semiconductor products resulting from contamination impurities can be suppressed.

One purpose of one invention disclosed by this embodiment is to offer the technology in which lowering of the die strength of a chip can be prevented and improvement in the manufacturing yield of semiconductor products can be realized.

Of the inventions disclosed in the present application, typical ones will next be summarized briefly.

Namely, as for one invention disclosed by the present application, when reducing a thickness of a semiconductor wafer, the back surface of the semiconductor wafer is ground with the grinding wheel which holds the diamond abrasive of fineness number, for example #5000 to #20000 with a binder including vitrifide which has a countless bubble (fine bubble), and impregnates a synthetic resin in the bubble so that a relatively thin crushing layer with a gettering function of less than 0.5 µm, less than 0.3 µm or less than 0.1 µm, for example in thickness may be formed at the back surface and the die strength after dividing or almost dividing the semiconductor wafer and making a chip may be secured.

And, as for one invention disclosed by the present application, when reducing a thickness of a semiconductor wafer, the back surface of the semiconductor wafer is ground with the grinding wheel which holds the diamond abrasive of fineness number, for example #5000 to #20000 with a binder including vitrifide and impregnates a synthetic resin inside a plurality of holes formed in the vitrifide so that a relatively thin crushing layer with a gettering function of less than 0.5 µm, less than 0.3 µm or less than 0.1 µm, for example in thickness may be formed at the back surface and the die strength after dividing or almost dividing the semiconductor wafer and making a chip may be secured.

Below, the outline of other inventions included in the present application is itemized and explained.

1. A manufacturing method of a semiconductor integrated circuit device, comprising the steps of:

(a) forming a circuit pattern over a first main surface of a semiconductor wafer which has a first thickness;

(b) making the semiconductor wafer a second thickness, grinding a second main surface of the semiconductor wafer using a first abrasive which has fixed abrasive;

(c) making the semiconductor wafer a third thickness, grinding the second main surface of the semiconductor wafer using a second abrasive which has a fixed abrasive whose particle diameter is smaller than the first abrasive; and (d) individually separating the semiconductor wafer into a chip;

wherein the second abrasive is a ceramic system (or glass system) grinding wheel which has a bubble (a proper pore such as a pore formed in a grinding wheel at the time of baking, and in the case of high porosity grinding wheels, what is depended on a foaming agent, i.e., an improper bubble type, is included), and is filled up (by impregnation etc.) with resin in the bubble (It is especially effective when impregnation of the organic resin etc. is made to the whole portion used of a grinding wheel. That is, filling of not only a surface but a bulk level is effective.).

2. A manufacturing method of a semiconductor integrated circuit device according to item 1, wherein the ceramic system grinding wheel (porous type grinding wheel) which has the bubble is a vitrified system (sintered glass system) grinding wheel, that is, a diamond abrasive which is abrasive, a pottery stone which is a binder (ceramics nature with low hardness), etc. are mixed, and heat sintering, or thermofusion (what was formed by methods other than heat is included) is made.

3. A manufacturing method of a semiconductor integrated circuit device according to item 1, wherein the ceramic system grinding wheel which has the bubble is a vitrified system grinding wheel (it is a concept which is opposed to what consists only of a proper pore) of high porosity which increased the volume which pores occupy with the foaming agent etc.

4. A manufacturing method of a semiconductor integrated circuit device according to any one of items 1-3, further comprising a step of:

(e) after the step (d), mounting the second main surface of the chip on a substrate.

5. A manufacturing method of a semiconductor integrated circuit device according to item 4, wherein between the step (c) and (e), except the said steps, there is no step which grinds or polishes the second main surface substantially.

Advantages achieved by some of the most typical aspects of the invention disclosed in the present application will be briefly described below.

That is, the lowering of the manufacturing yield of semiconductor products resulting from contamination impurities can be suppressed. Preventing lowering of the die strength of a chip, improvement in the manufacturing yield of semiconductor products can be realized.

BRIEF DESCRIPTION OF THE DRAWINGS

FIG. 2 is a principal part side view in the manufacturing process of the semiconductor integrated circuit device by Embodiment 1 of the present invention;

FIGS. 3A and 3B are principal part enlarged sectional views of the back surface side portion of the semiconductor wafer by Embodiment 1 of the present invention;

DETAILED DESCRIPTION OF THE PREFERRED EMBODIMENTS

Figure 1:
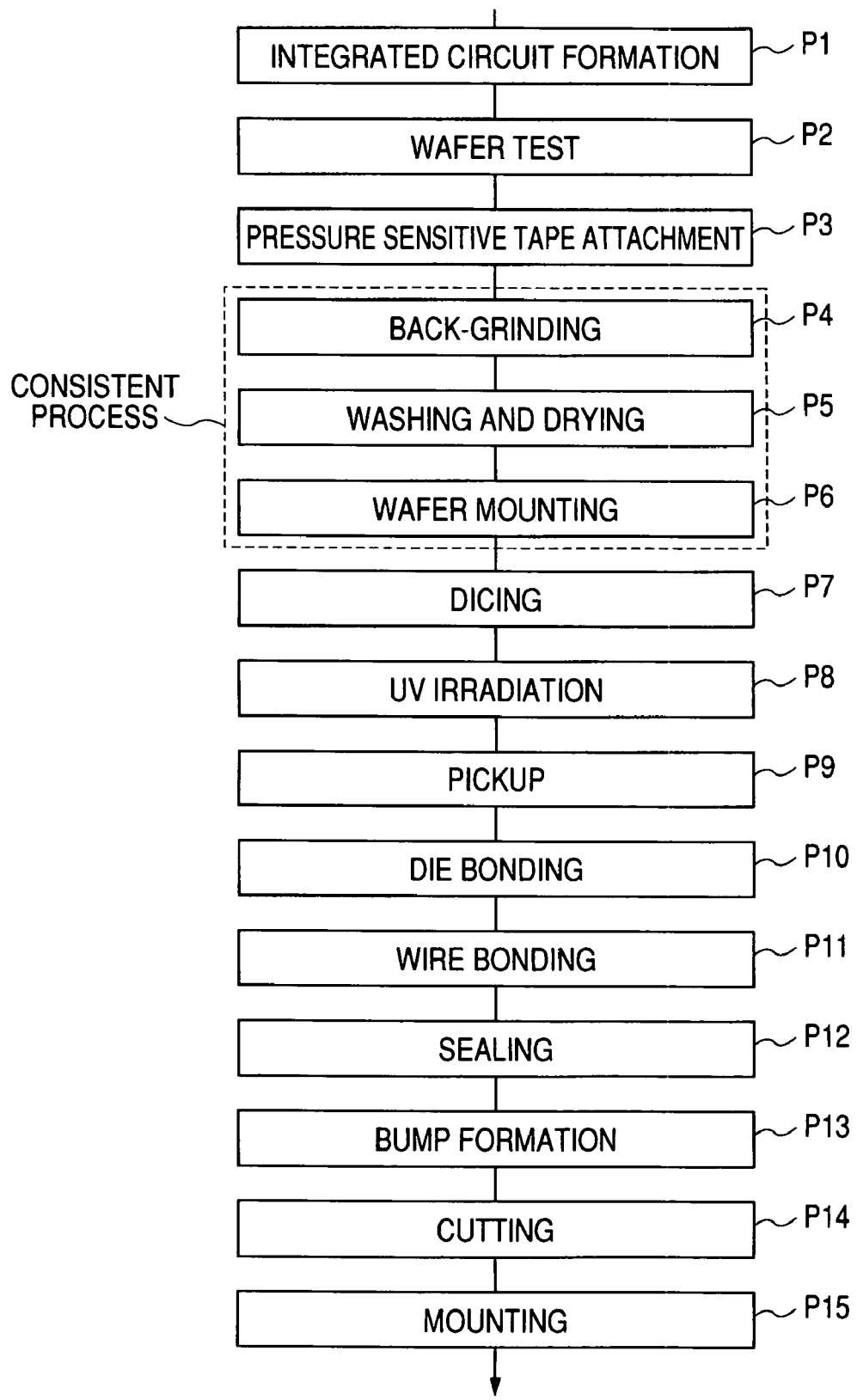
FIG. 1 is a process chart of the manufacturing method of the semiconductor integrated circuit device by Embodiment 1 of the present invention.

Hereafter, embodiments of the invention are explained in detail based on drawings. In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number. Furthermore, in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range. And, in all the drawings for describing the embodiments, members of a like function will be identified by like reference numerals and overlapping descriptions will be omitted. Further, in the drawings used in the below-described embodiments, even a plan view is sometimes partially hatched for facilitating understanding of it.

In the following embodiments, when calling it a semiconductor wafer, it is mainly concerned with Si (silicon) single-crystal wafer, but not only it but an SOI (Silicon on Insulator) wafer, the insulating film substrate for forming an integrated circuit on it, etc. shall be pointed out. The form shall include not only a circle or a near circle but a square, a rectangle, etc. When mentioning the member of gas, a solid, or a liquid, the component specified there is considered as one of main components, but except for the case of writing clearly such especially or the case of being theoretically clear, other components are not excepted. Namely, when calling it "silicon" about a semiconductor substrate, a surface, and a member, except for the case of writing clearly or the case of theoretically clearly not being so, it is not limited to pure silicon, but a thing into which the impurity was doped, polysilicon, amorphous silicon, a thing to which the additive was added, an alloy (for example, SiGe) of the silicon resemblance which uses silicon as main elements, etc. shall be included.

Figure 21:
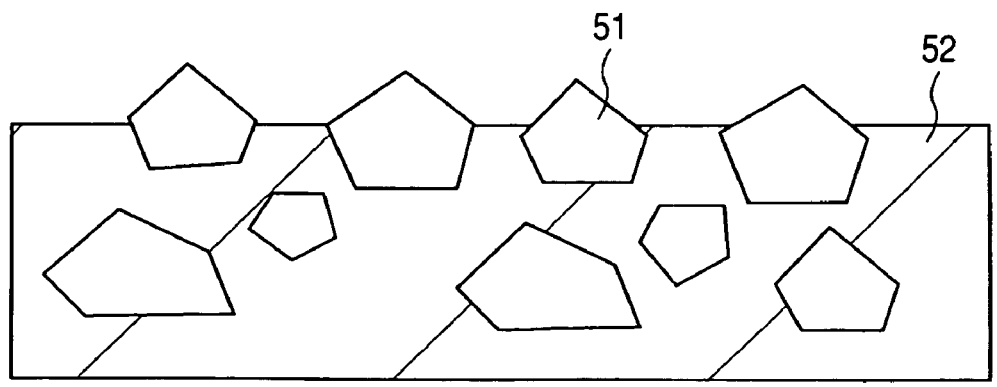
FIG. 21 is a principal part cross-sectional view of fixed abrasive.

The representative example of abrasive which has fixed abrasive is the so-called grinding wheel, and is considered as the structure which has a plurality of fine abrasive particles being abrasive, and a binder which combines the fine abrasive particles. An example of the principal part cross-sectional view of fixed abrasive is shown in FIG. 21. Reference 51 shows an abrasive particle which includes a diamond etc., and reference 52 shows a binder. There are blends, such as feldspar and meltable clay, a good synthetic resin (things other than the synthetic rubber or crude rubber), etc. as a binder. In the grinding step using the abrasive which has fixed abrasive, since the abrasive particle is being fixed, the mechanical force is applied to the surface ground of a semiconductor wafer (a surface to be ground), and a crushing layer is formed in the surface of a semiconductor wafer to be ground. The grinding processing by this embodiment is a thing adapting this, and a crushing layer is being tried to be formed in the surface of a semiconductor wafer to be ground well using the abrasive which has fixed abrasive. There is a floating abrasive particle to fixed abrasive. A floating abrasive particle is the abrasive powder included in the slurry etc., and when this floating abrasive particle is used, since the abrasive particle is not being fixed, it is common that a crushing layer is not formed in the surface to be ground of the semiconductor wafer. Including the case (dry-polishing method) where it polishes only with an abrasive cloth, from the point that it does not form a crushing layer, the so-called polishing method is classified into polishing using this floating abrasive particle for convenience.

Embodiment 1

Figure 4A:
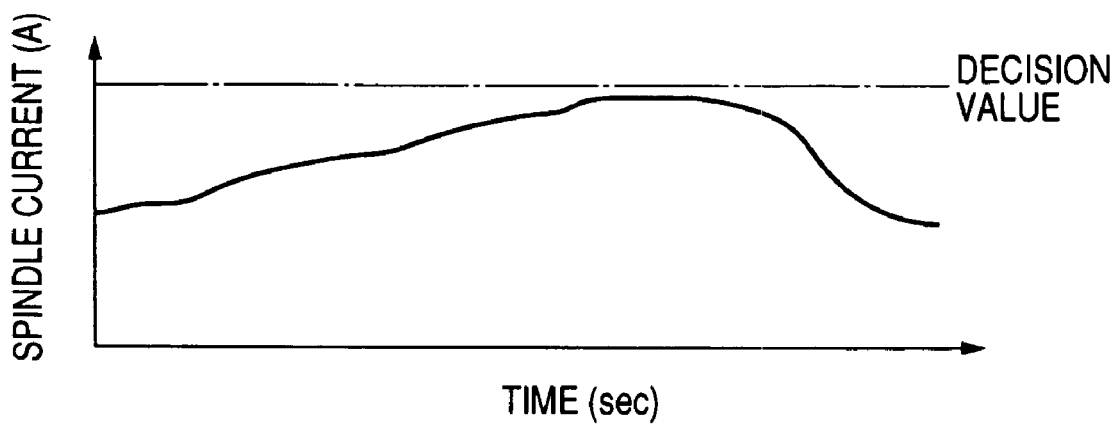
FIGS. 4A and 4B are wave form charts of the spindle current value recorded with the spindle motor of the grinder apparatus by Embodiment 1 of the present invention.
Figure 4B:
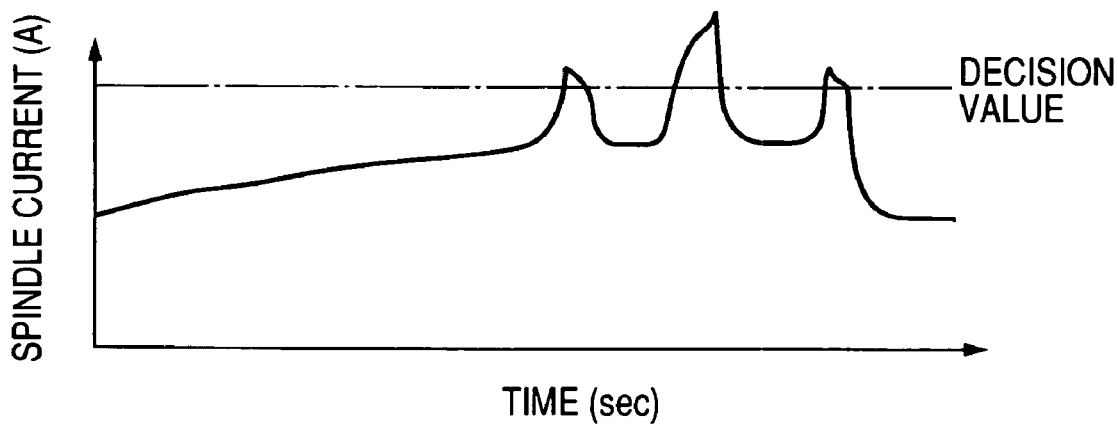
Figure 5:
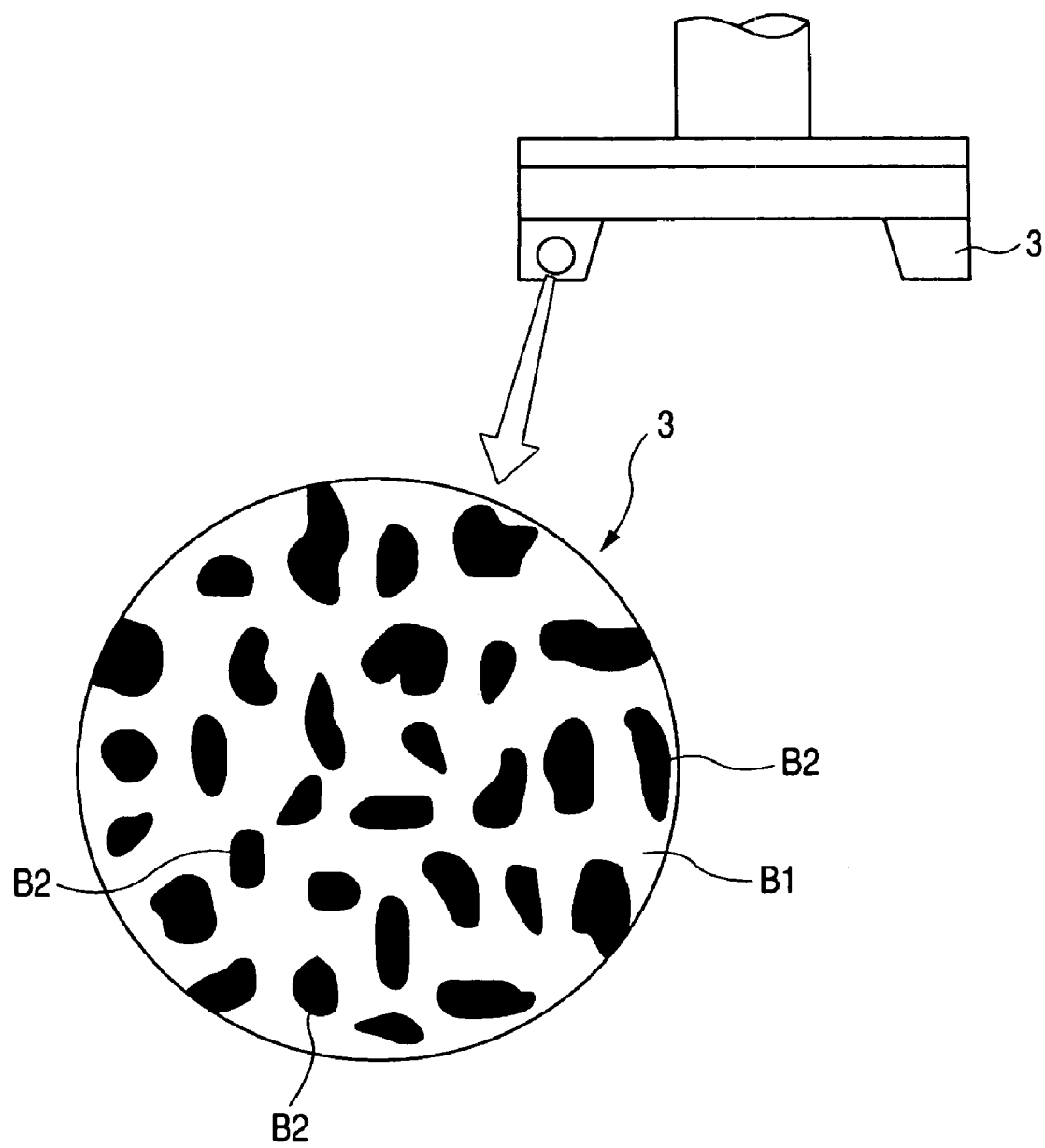
FIG. 5 is a principal part cross-sectional view of the diamond wheel by Embodiment 1 of the present invention.
Figure 6:
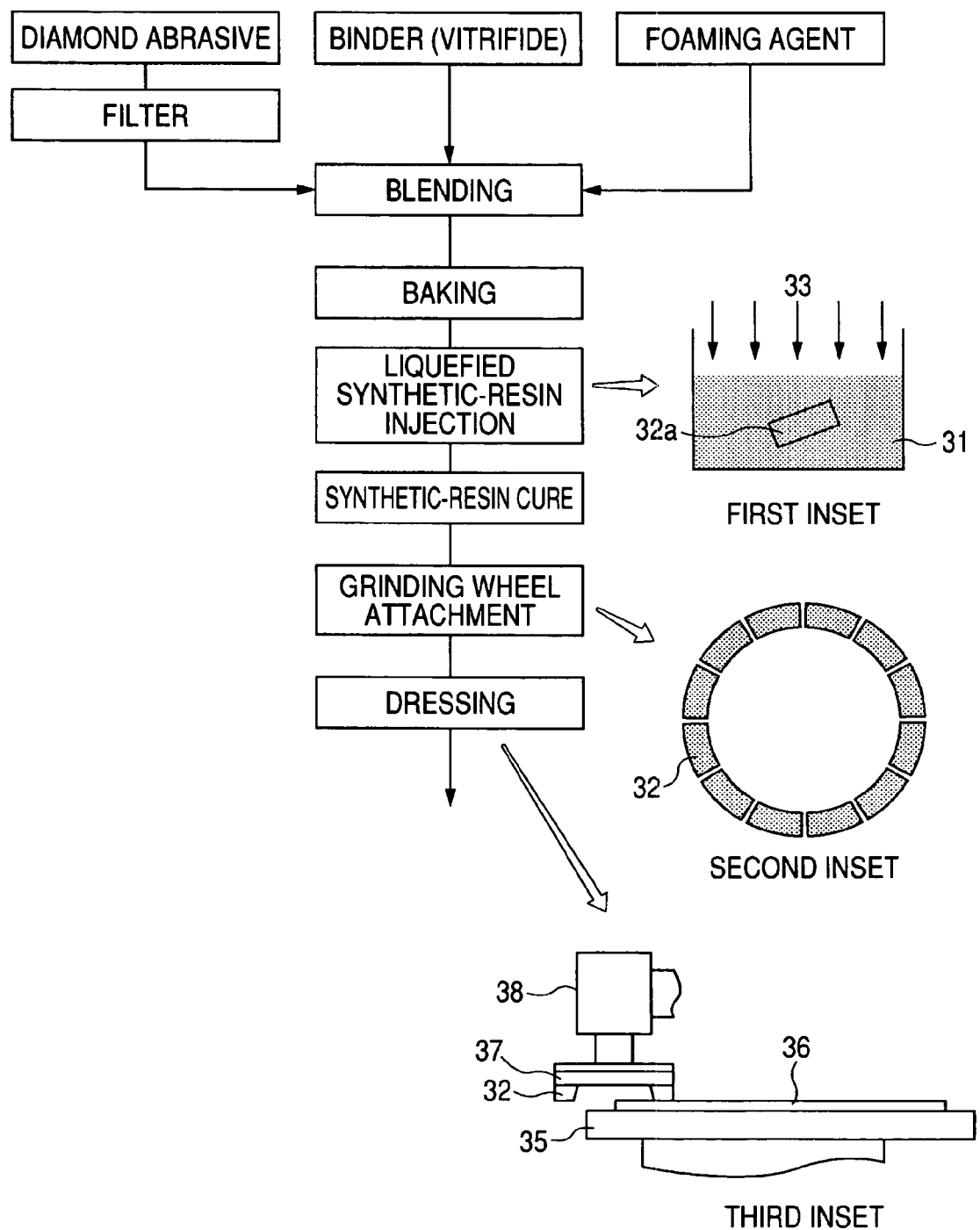
FIG. 6 is a process chart of the manufacturing method of the diamond wheel by Embodiment 1 of the present invention.
Figure 7:
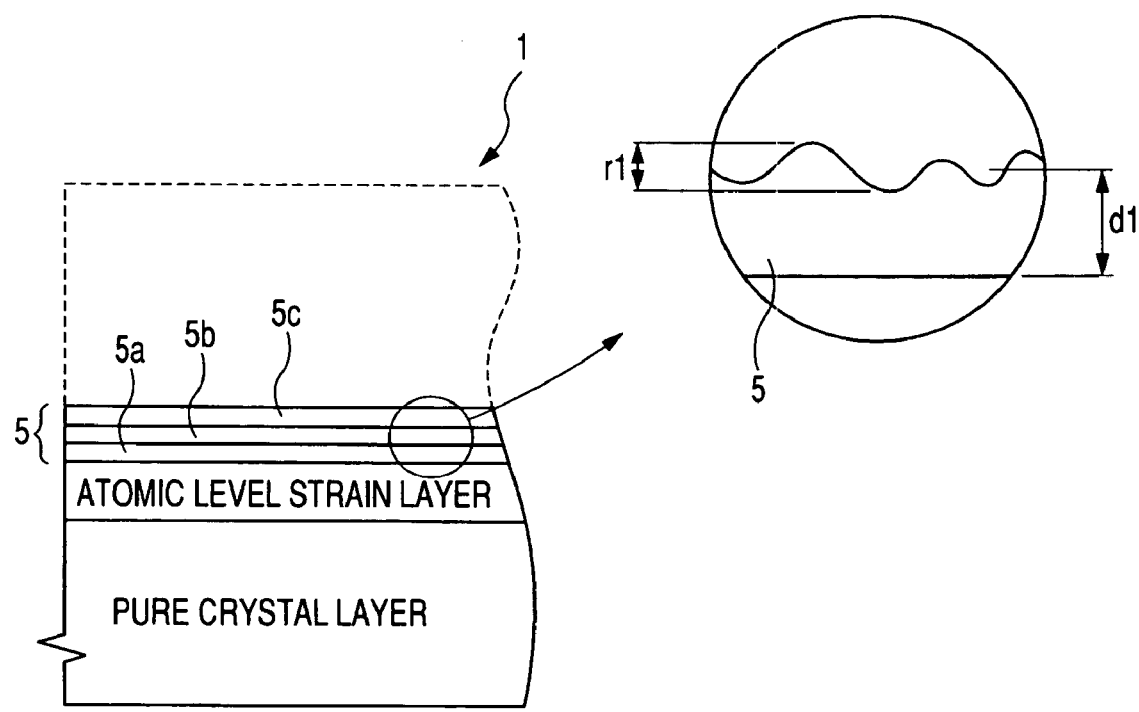
FIG. 7 is a principal part enlarged sectional view of the back surface side portion of the semiconductor wafer by Embodiment 1 of the present invention.
Figure 8A:
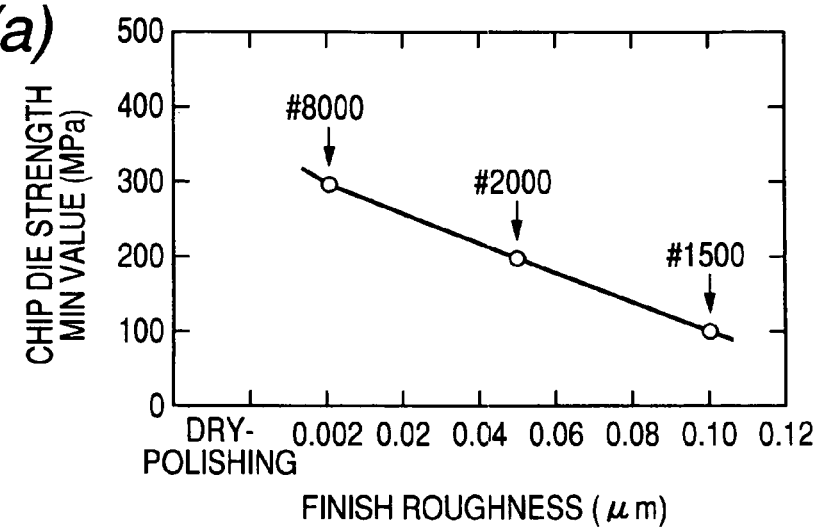
FIGS. 8A, 8B and 8C are a graphical representation showing the relation between the die strength of a chip, and the finish roughness of the back surface of a semiconductor wafer, a graphical representation showing the relation between the finish roughness of the back surface of a semiconductor wafer, and the particle diameter of an abrasive, and a graphical representation showing the relation between crushing layer thickness and the particle diameter of an abrasive, respectively.
Figure 8B:
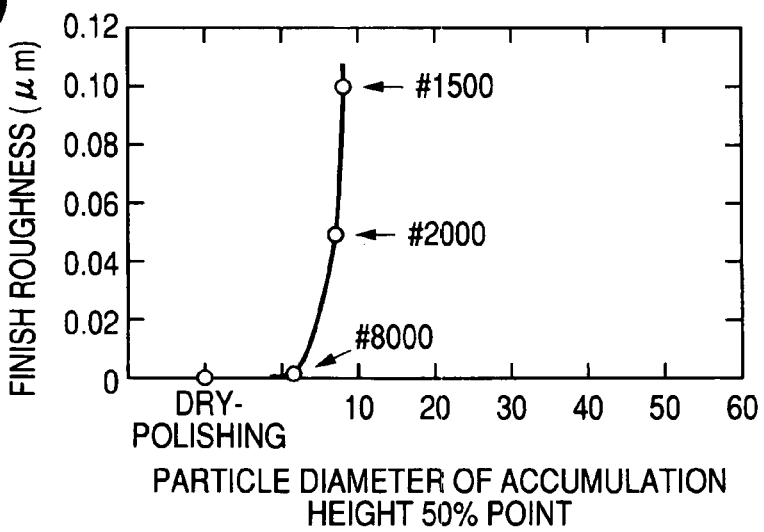
Figure 8C:
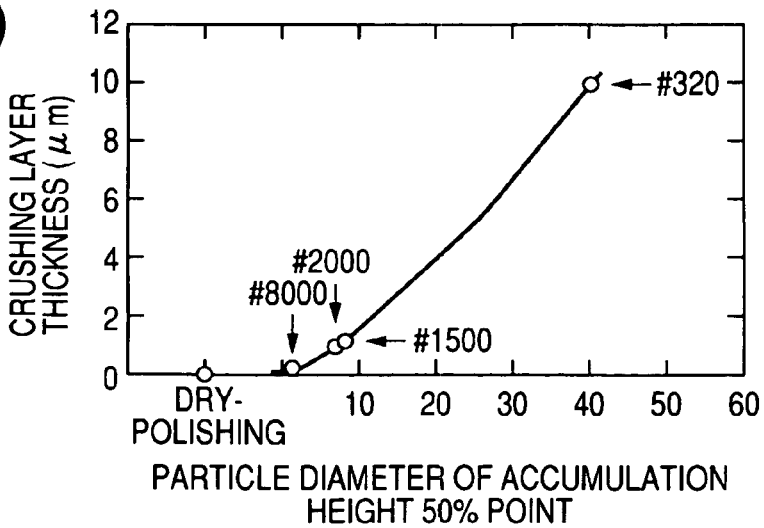
Figure 18:
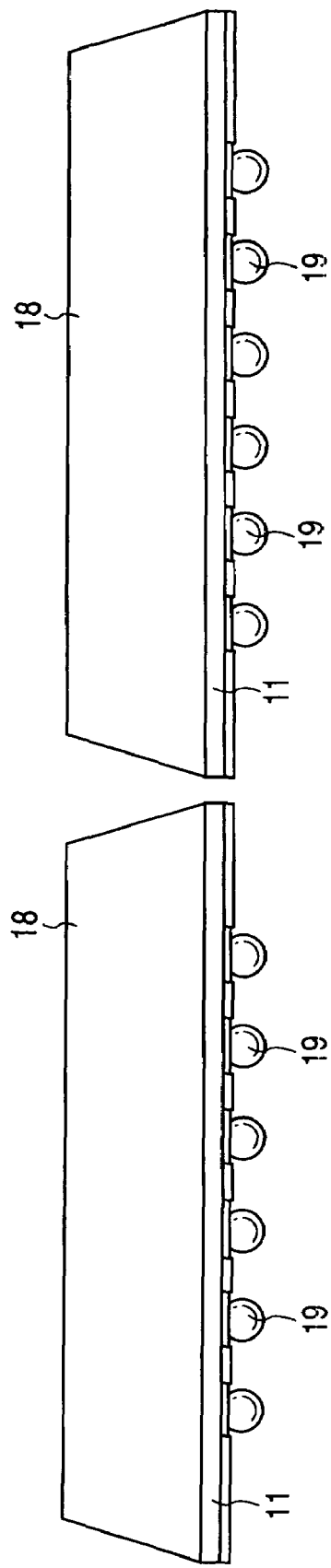
FIG. 18 is a principal part side view in the manufacturing process of the semiconductor integrated circuit device following FIG. 17.
Figure 19:
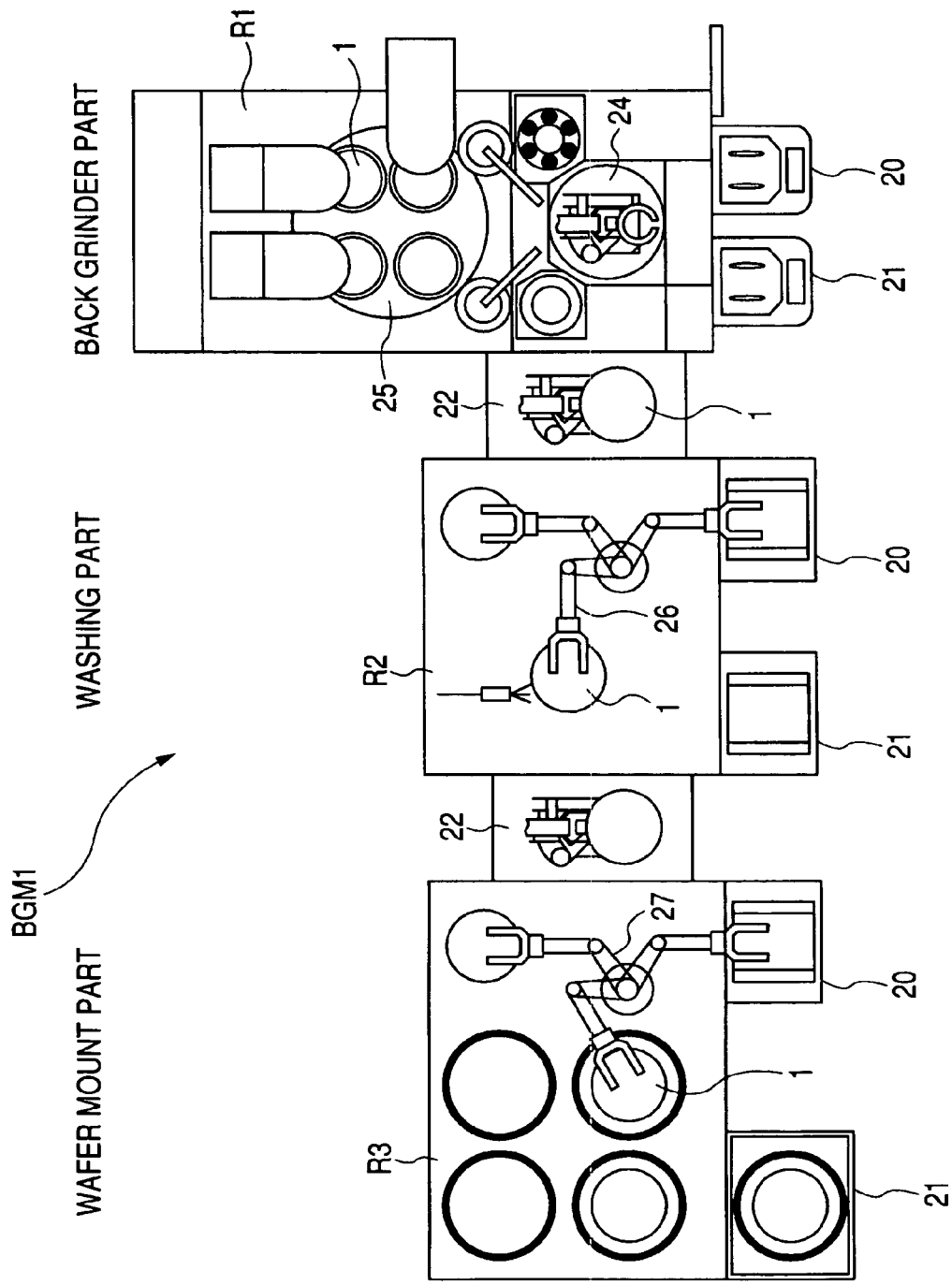
FIG. 19 is explanatory drawing of the consistent processing equipment by Embodiment 1 of the present invention used by wafer mounting from back-grinding.

A manufacturing method of a semiconductor integrated circuit device by Embodiment 1 is explained to process order using FIG. 19 from FIG. 1. FIG. 1 is a process chart of the manufacturing method of a semiconductor integrated circuit device, FIG. 2, and FIG. 9A to FIG. 18 are the principal part side views in the manufacturing process of a semiconductor integrated circuit device, FIGS. 3A and 3B are principal part enlarged sectional views of the back surface side portion of a semiconductor wafer, FIGS. 4A and 4B are wave form charts of the spindle current value recorded with the spindle motor of a grinder apparatus, FIG. 5 is a principal part enlarged sectional view of a diamond wheel, FIG. 6 is a process chart of the manufacturing method of a diamond wheel, FIG. 7 is a principal part enlarged sectional view of the back surface side portion of a semiconductor wafer, and FIGS. 8A, 8B, and 8C are a graphical representation showing the relation between the die strength of a chip, and the finish roughness of the back surface of a semiconductor wafer, a graphical representation showing the relation between the finish roughness of the back surface of a semiconductor wafer, and the particle diameter of abrasive, and a graphical representation showing the relation between crushing layer thickness and the particle diameter of abrasive, respectively. FIG. 19 is explanatory drawing of the consistent processing equipment used by wafer mounting from a back-grinding. The following explanation explains each step, such as a back-grinding to die bonding which joins the chip individually separated on the substrate, further to sealing which protects a plurality of laminated chips by resin etc., after forming a circuit pattern on a semiconductor wafer.

First, an integrated circuit is formed in the circuit formation surface (first main surface) of a semiconductor wafer (integrated circuit forming step P1 of FIG. 1). A semiconductor wafer includes silicon single crystal, the diameter is 300 mm and thickness (first thickness) is more than or equal to 700 µm (value at the time of the input to a wafer step), for example.

Next, the good and the defect of the respective chips made on the semiconductor wafer are judged (wafer test process P2 of FIG. 1). First, a semiconductor wafer is laid on a stage for measurement, and when a probe is contacted to the electrode pad of an integrated circuit and a signal wave form is inputted into it from an input terminal, a signal wave form will be outputted from an output terminal. When the tester reads this, the good and the defect of the chip are judged. Here, the probe card which has arranged the probe according to all the electrode pads of an integrated circuit is used, and from the probe card, the signal line corresponding to each probe has come out, and it connects with the tester. Defective marking is struck to the chip judged to be defective.

Next, an adhesive tape (Pressure-Sensitive adhesive tape) is stuck on the circuit formation surface of a semiconductor wafer (pressure sensitive tape sticking step P3 of FIG. 1). As an adhesive tape, a self-peeling type tape, i.e., UV cure type, a heat-curing type, or EB cure type is sufficient, and a non-self peeling type tape, i.e., common adhesive tape which is not UV cure type, a heat-curing type, or EB cure type, either, is also sufficient here. In the case of a non-self peeling type tape, though self-detachability cannot be used, there is an advantage that a change of the write-in information on memory system circuits, such as a nonvolatile memory, the characteristics shift, and undesirable change of surface characteristics of surface-protection members, such as a polyimide layer, or a wiring insulating member, etc. generated when irradiating ultraviolet rays (energy ray irradiation or heating) to the circuit formation surface of a semiconductor wafer, are avoidable.

Below, the example of a non-self peeling type tape is explained. The adhesive is applied to the adhesive tape and this sticks an adhesive tape with the circuit formation surface of the semiconductor wafer. The adhesive tape uses polyolefine as a base, for example, the adhesive of an acrylic system is applied, and the release material which includes polyester is stuck on it further. The release material is a mold-releasing paper, for example, the release material is removed and the adhesive tape is stuck on the semiconductor wafer. The thickness of an adhesive tape is 130 to 150 µm, and adhesion is 200-300 g/20 mm (it expresses as the strength at the time of the tape of 20 mm width peeling), for example. The adhesive tape which did mold-releasing-processing the back surface of the substrate may be used, without release material.

Next, the thickness of the semiconductor wafer is made predetermined thickness, for example, less than 100 µm, less than 80 µm, or less than 60 µm, grinding the back surface (surface of the opposite side to circuit formation surface, second main surface) of a semiconductor wafer, and a crushing layer is formed in the back surface of the semiconductor wafer (back-grinding step P4 of FIG. 1). In this back-grinding, the rough grinding, finish grinding, and fine finish grinding which are explained below are performed one by one.

First, as shown in FIG. 2, the back surface of semiconductor wafer 1 is performed rough grinding. After transporting semiconductor wafer 1 to a grinder apparatus and making vacuum adsorption of the circuit formation surface of semiconductor wafer 1 to chuck table 2, by performing rough grinding pressing rotating first abrasive (for example, fineness number from #320 to #360: fineness-number # showing polished abrasive, or a diameter of a grinding abrasive particle corresponds to the magnitude of the opening of sieve which classifies an abrasive particle (for example, diamond) when manufacturing a grinding wheel etc. In other words, it corresponds to the diameter of main abrasive particles. When an example is shown, the particle diameter of #280 is about 100 µm, the particle diameter of #360 is about 40 to 60 µm, the particle diameter of #2000 is about 4 to 6 µm, the particle diameter of #4000 is about 2 to 4 µm, and the particle diameter of #8000 is about 0.2 µm. The present application describes the diameter of an abrasive particle based on this. There is JIS regarding less than #320.) 3 to the back surface of semiconductor wafer 1, the thickness of semiconductor wafer 1 is made to decrease till predetermined thickness (second thickness). The first abrasive is the abrasive which has fixed abrasive, and, semiconductor wafer 1 is ground by, for example, about 600 to 700 µm by this rough grinding. As for the second thickness of semiconductor wafer 1 that remains by this rough grinding, less than 140 µm, for example, is considered to be the suitable range (it cannot be overemphasized that it is not limited to this range depending on another conditions). Although less than 120 µm can be considered as range suitable for mass production, it is thought that the range of less than 100 µm is still more preferred. Since adhesive tape BT1 is stuck on the circuit formation surface of semiconductor wafer 1, the integrated circuit is not destroyed. In a general process, it is thought that more than or equal to #100 and less than #700 is suitable for the fineness number range of the above-mentioned first abrasive.

Then, the back surface of semiconductor wafer 1 is performed finish grinding. After making vacuum adsorption of the circuit formation surface of semiconductor wafer 1 to the chuck table here using the same grinder apparatus as the FIG. 2, by performing finish grinding pressing the rotating second abrasive (for example, fineness number from #1500 to #2000) to the back surface of semiconductor wafer 1, strain of the back surface of semiconductor wafer 1 generated at the time of the above-mentioned rough grinding is removed, and simultaneously the thickness of semiconductor wafer 1 is made to decrease till predetermined thickness (third thickness). The second abrasive is the abrasive which has fixed abrasive, and semiconductor wafer 1 is ground by, for example, about 25 to 40 μm by this finish grinding. As for the third thickness of semiconductor wafer 1 which remains by this finish grinding, less than 110 μm, for example, is considered to be the suitable range (it cannot be overemphasized that it is not limited to this range depending on another conditions). Although less than 90 μm can be considered as range suitable for mass production, it is thought that the range of less than 70 μm is still more preferred.

The principal part enlarged sectional view of the back surface side portion of semiconductor wafer 1 which was performed rough grinding using the above-mentioned first abrasive is shown in FIG. 3A, and the principal part enlarged sectional view of the back surface side portion of semiconductor wafer 1 which was performed finish grinding using the above-mentioned second abrasive is shown in FIG. 3B. In rough grinding, an atomic level strain layer and a crushing layer (an amorphous layer/polycrystal layer/micro crack layer) are formed on the pure crystal layer of the back surface of semiconductor wafer 1. Also in finish grinding although an atomic level strain layer and first crushing layer (amorphous layer 4a/polycrystal layer 4b/micro crack layer 4c) 4 are formed on the pure crystal layer of the back surface of semiconductor wafer 1, the thickness of a pure crystal layer and an atomic level strain layer and first crushing layer 4 becomes thinner than the thickness of the pure crystal layer and the atomic level strain layer and the crushing layer after rough grinding, respectively. As for the thickness of this first crushing layer 4, less than 2 μm is considered to be the suitable range, for example (it cannot be overemphasized that it is not limited to this range depending on another conditions). Although less than 1 μm can be considered as range suitable for mass production, it is thought that the range of less than 0.5 μm is still more preferred.

Then, the back surface of semiconductor wafer 1 is performed fine finish grinding. After making vacuum adsorption of the circuit formation surface of semiconductor wafer 1 to the chuck table here using the same grinder apparatus as the FIG. 2, by performing fine finish grinding pressing the rotating third abrasive to the back surface of semiconductor wafer 1, the thickness of semiconductor wafer 1 is made to decrease till the predetermined thickness (fourth thickness). The third abrasive is also the abrasive which has fixed abrasive, and semiconductor wafer 1 is ground by, for example, about 3 to 5 μm by this fine finish grinding. As for the fourth thickness of semiconductor wafer 1 which remains by this fine finish grinding, less than 100 μm, for example, is considered to be the suitable range (it cannot be overemphasized that it is not limited to this range depending on another conditions). Although less than 80 μm can be considered as range suitable for mass production, it is thought that the range of less than 60 μm is still more preferred.

As for the fineness number of the fixed abrasive of the above-mentioned third abrasive, #3000 to #100000, for example, is considered to be the suitable range (it cannot be overemphasized that it is not limited to this range depending on another conditions). Although #4000 to #50000 can be considered as range suitable for mass production, it is thought that the range of #5000 to #20000 is still the most preferred. In Embodiment 1, the perimeter range which makes, for example #8000 a central value is used, the lower limit of the fineness number of the fixed abrasive of this third abrasive is decided in consideration of the die strength of a chip, and the upper limit is decided in consideration of the gettering effect.

By the way, third abrasive is the so-called grinding wheel that has fixed abrasive, and is hardening and using a plurality of fine fixed abrasive, for example, a diamond abrasive, with the binder (bond). As for a binder, a synthetic resin (materials other than the synthetic rubber or crude rubber, for example, epoxy system resin, urethane system resin, phenol system resin, and polyimide system resin) or a porcelain nature, such as (material which has feldspar as a main component, or material which has feldspar as a main component and which mixed meltable clay for example, vitrifide, etc.) etc. is used.

However, the various technical problems explained below exist about the third abrasive used for fine finish grinding, for example, the diamond wheel which has a diamond abrasive of fineness number #5000 to #20000.

That is, since the strength of a synthetic resin is weak when a synthetic resin is used for the binder of a diamond wheel, a diamond abrasive is hidden in a synthetic resin at the time of a back-grinding, and there is a problem of grinding capacity declining and it becoming impossible to grind semiconductor wafer 1. Since the strength of virifide is strong when a porcelain nature, for example, virifide, is used for the binder of a diamond wheel, a load is applied to the spindle motor of a grinder apparatus making the diamond wheel rotate, and the trouble of the revolution of a diamond wheel stopping occurs.

Then, analyses of the diamond wheel which made it easy to drop out using for a binder vitrifide which formed the countless bubble and was made into the shape of pumice are made as the above-mentioned measures. The bubble is distributed over the inside of a vitrified binder at random, and there is no regularity in particular also in the configuration and magnitude. However, in order to perform fine finish grinding the back surface of semiconductor wafer 1, it is necessary to make the particle diameter of the diamond abrasive small (for example, fineness number from #5000 to #20000), and simultaneously to make moderately easily and moderately hard vitrifide which is a binder. For example, although it is possible to control the brittleness and hardness by magnitude of the bubble in the inside of a vitrified binder, since it is difficult to maintain the magnitude of a bubble at about 1 constant value, the problem that the brittleness and hardness of a vitrified binder differ from each other between diamond wheels has occurred.

For example, since the brittleness of a vitrified binder becomes remarkable (it is easy to drop out) in the case of a diamond wheel with a relatively large bubble of a vitrified binder, a grinding blemish and a grinding line may occur at the back surface of semiconductor wafer 1. Although there is also a method of reinforcing a diamond wheel, covering the periphery of a diamond wheel with the plastic of the thickness of about 1 to 2 μm as the measures, since the inside of the diamond wheel is not held, the inside is worn out ahead of the periphery, and when the diamond wheel is used for a long time, it becomes impossible to grind the back surface of semiconductor wafer 1 uniformly. On the other hand, since the hardness of a vitrified binder becomes remarkable (it is hard to drop out) in the case of a diamond wheel with a relatively small bubble of a vitrified binder, the trouble of a load being applied to the spindle motor making a diamond wheel rotate of a grinder apparatus, and the revolution of a diamond wheel stopping occurs.

An example of a normal wave form of the spindle current value recorded with the spindle motor of the grinder apparatus is shown in FIG. 4A, and an example of an abnormal wave form of the spindle current value is shown in FIG. 4B. When grinding is normal, a spindle current value increases or decreases smoothly, and does not exceed the fixed spindle current value (decision value) used as the criteria which judge the abnormalities of the spindle motor. However, when a certain abnormalities occur in grinding and a load is applied to the spindle motor, the phenomenon that the spindle current value increases suddenly is seen. For example, when the spindle current value exceeds the decision value, the grinder apparatus senses the abnormalities of grinding, and by taking the measures of stopping the revolution of the diamond wheel, the progress of unusual grinding after it is stopped.

So, in Embodiment 1, a diamond abrasive is held with the vitrified binder which has countless bubbles, and the diamond wheel which impregnated the synthetic resin having viscosity into the countless bubbles of a vitrified binder is used. The principal part enlarged sectional view of the diamond wheel by Embodiment 1 of the present invention is shown in FIG. 5. Although the diamond abrasive is not described at FIG. 5, the diamond abrasive is held with the vitrified binder.

Although it is not necessary to arrange the magnitude in particular of the bubble of vitrified binder B1, as a diameter of a bubble (The configuration of the bubble is not a perfect globular form, but making a cubic shape which made false to a rectangle, a square, a triangular pyramid, etc. Therefore, the diameter in this case is the rough value which assumed the configuration of the bubble as almost spherical and searched for it, and is not a value showing the exact dimension of the bubble.), 10 to 250 µm, for example, is considered to be the suitable range (it cannot be overemphasized that it is not limited to this range depending on another conditions). Although 30 to 200 µm can be considered as range suitable for mass production, the perimeter range which makes 100 µm a central value, such as 50 to 150 µm, is considered to be the most suitable, further. Although 100 cps or more, for example, is considered to be the suitable range (it cannot be overemphasized that it is not limited to this range depending on another conditions) as viscosity of synthetic-resin B2 impregnated in the countless bubbles of vitrified binder B1, and 500 cps or more can be considered as range suitable for mass production, 1000 cps or more is considered to be the most suitable.

By impregnating synthetic-resin B2 which has viscosity and whose strength is weaker than vitrified binder B1 in the countless bubbles of vitrified binder B1, unusual falling of vitrified binder B1 which held the diamond abrasive can be prevented even if the bubble of vitrified binder B1 was relatively large, and even if the bubble of vitrified binder B1 is relatively small, hardness to the extent that a load is applied to the spindle motor of a grinder apparatus is lost to a diamond wheel. Therefore, since the diamond wheel which has no unusual falling and has moderate hardness can be formed even if the magnitude of a bubble of vitrified binder B1 varies, the variation of a grinding state of the back surface of semiconductor wafer 1 generated between diamond wheels can be reduced. It is not necessary to make impregnation of the inside of the countless bubbles of vitrified binder B1 100% by synthetic-resin B2.

Next, the manufacturing method of a diamond wheel is explained using a process chart shown in FIG. 6.

First, diamond abrasives, for example, are sifted and the diamond abrasive (fineness number from #5000 to #20000, for example) which has desired particle diameter is chosen. Subsequently, after mixing vitrified binder B1 mentioned above, the diamond abrasive whose particle diameter was arranged and a foaming agent (pore giving agent), and pouring in a mixed material in the groove surrounded with a mold, the diamond wheel cell which has countless vacant bubbles is formed by baking at the temperature about 1200 to 1350° C.

Subsequently, synthetic-resin B2 mentioned above is impregnated in the countless vacant bubbles of vitrified binder B1. For example, as shown in the first inset (drawing explaining an example of the injection method of a synthetic resin) of FIG. 6, synthetic resin 31 is impregnated in the countless bubble of vitrified binder B1 by dipping diamond wheel cell 32a which has countless vacant bubbles in liquefied synthetic resin 31 maintained at room temperature, and applying pressure 33. Then, synthetic resin 31 in the countless bubbles of vitrified binder B1 is cured at the temperature of, for example about 200° C. The diamond abrasive is held with vitrified binder B1 which has countless bubbles by this, and the diamond wheel cell which impregnated synthetic-resin B2 in the countless bubbles is formed.

Subsequently, as shown, for example in the second inset (drawing explaining an example of the assembly of a grinding wheel cell) of FIG. 6, a plurality of diamond wheel cells 32 are attached to a wheel. Then, as shown, for example in the third inset (drawing explaining an example of the dressing method of a grinding wheel) of FIG. 6, by pressing a plurality of diamond wheel cells 32 attached to wheel 37 against dress board 36 installed on chuck table 35, and rotating wheel 37 using spindle motor 38, dressing of the grinding surface of diamond wheel cell 32 is performed, and a diamond wheel is formed.

Next, the back surface of semiconductor wafer 1 after performing fine finish grinding the back surface of semiconductor wafer 1 using the diamond wheel which holds diamond abrasives (diamond abrasive of fineness number #5000 to #20000, typically) with vitrified binder B1 which has countless bubbles, and impregnated synthetic-resin B2 which has viscosity in the bubble of vitrified binder B1 for third abrasive is explained below.

As shown in FIG. 7, in the fine finish grinding, an atomic level strain layer and second crushing layer (amorphous layer 5a/polycrystal layer 5b/micro crack layer 5c) 5 are formed on the pure crystal layer of the back surface of semiconductor wafer 1, and the thickness of an atomic level strain layer and second crushing layer 5 is formed more thinly than the thickness of the atomic level strain layer and first crushing layer 4 after the finish grinding, respectively. When a pure crystal layer (pure silicon crystal structure part) is exposed to the back surface of semiconductor wafer 1 and contamination impurities, for example, heavy metal impurities etc., adhere to the back surface of semiconductor wafer 1, the contaminant will infiltrate into semiconductor wafer 1 easily. There is a problem of the contamination impurities which infiltrated into semiconductor wafer 1 diffusing the inside of semiconductor wafer 1, reaching to the circuit formation surface of semiconductor wafer 1, and causing the characteristic defect of the semiconductor element formed in the circuit formation surface. So, in Embodiment 1, second crushing layer 5 is formed on the back surface of semiconductor wafer 1 on purpose, and contamination impurities are made to be captured by second crushing layer 5. Hereby, infiltration and diffusion of the contamination impurities to semiconductor wafer 1 can be suppressed. Also in heavy metal, as for Cu, since the diffusion coefficient is $6.8 \times 10-2$/sec (at 150° C.) and is high as compared with the diffusion coefficient (the diffusion coefficient of Fe is $2.8 \times 10-13$/sec (at 150° C.)) of another heavy metal and it is easy to reach to the circuit formation surface of semiconductor wafer 1, it is thought that it is one of the main contamination impurities which cause the characteristic defect of a semiconductor element. The binding material layer of a dicing tape and the binding material layer used for die bonding can be mentioned to this source of invasion of Cu, for example. In these binding material layer, since a little Cu(s) may be mixing with various impurities and debris (filler) and these binding material layer moreover touches semiconductor wafer 1, and the back surface of a chip directly, infiltration of Cu is easy.

By the way, shown, for example in FIG. 8A, the min value of chip die strength becomes large as the finish roughness of the back surface of semiconductor wafer 1 becomes small, that is, as the fineness number (for example, refer to Japanese Industrial Standard JISR6001) of the abrasive particle of abrasive becomes large, and when mirror finish of the back surface of semiconductor wafer 1 is made, for example by a dry-polishing, the min value of chip die strength turns into maximum. This is because the particle diameter of the grinding wheel adhering to abrasive becomes small and the roughness of the back surface (finish surface) of semiconductor wafer 1 becomes small as are shown in FIG. 8B and the fineness number of the abrasive particle of abrasive becomes large. When saying furthermore, as shown in FIG. 8C, when the roughness of the above-mentioned finish surface becomes small, crushing layer thickness will become thin and this will bring about improvement in the die strength of a chip. However, the gettering effect falls as the above-mentioned crushing layer thickness with the gettering effect becomes thin, and since this gettering effect is lost when mirror finish of the back surface of semiconductor wafer 1 is made by a dry-polishing for example, contamination impurities permeate from the back surface of semiconductor wafer 1, they diffuse to the circuit formation surface of semiconductor wafer 1, and the characteristic defect of a semiconductor element occurs. For this reason, in the fine finish grinding using the third abrasive, it is required to choose the thickness of second crushing layer 5 and finish roughness compatible to some extent in the die strength of a chip and the gettering effect.

As for the thickness of the above-mentioned second crushing layer 5, based on these things, less than 0.5 μm (that is, it is more advantageous to be comparatively thicker in order to secure the die strength of a chip) is considered to be the suitable range, for example (it cannot be overemphasized that it is not limited to this range depending on another conditions). Although less than 0.3 μm can be considered as range suitable for mass production, it is thought that the range of less than 0.1 μm (it is because it is satisfactory when it is more than the lower limit which can prevent infiltration and diffusion of contamination impurities) is still more preferred. The thickness of second crushing layer 5 here is the par thickness (for example, d1 shown in FIG. 7) calculated from the average value of two or more places (for example, five points or ten points), measuring the thickness of second crushing layer 5 in two or more places in semiconductor wafer 1 (for example, five points or ten points), for example using a thickness measurement meter.

As for the finish roughness (for example, peak magnitude of the surface of second crushing layer 5) of the above-mentioned second crushing layer 5, less than 0.1 μm is considered to be the suitable range, for example. Although less than 0.05 μm can be considered as range suitable for mass production, it is thought that the range of less than 0.01 μm is still more preferred. Here, finish roughness of second crushing layer 5 is the par roughness calculated from the average value of two or more places (for example, five points or ten points), measuring the peak magnitude (for example, r1 shown in FIG. 7) of the surface of second crushing layer 5 in two or more places in semiconductor wafer 1 (for example, five points or ten points) using, for example, the surface roughness meter, The finish roughness by a dry-polishing is equivalent to about 0.0001 μm, for example.

Thus, by forming relatively thin second crushing layer 5, for example, the second crushing layer 5 of the thickness of less than 0.5 μm, less than 0.3 μm, or less than 0.1 μm, on the back surface of semiconductor wafer 1, grinding the thickness of semiconductor wafer 1 to, for example, less than 100 μm, less than 80 μm, or less than 60 μm by the above-mentioned back-grinding, without reducing the die strength of a chip, infiltration of the contamination impurities from the back surface of semiconductor wafer 1 can be prevented simultaneously, and the characteristic defect of the semiconductor element resulting from contamination impurities can be prevented. Hereby, lowering of the manufacturing yield of semiconductor products can be suppressed. And since a step which differs greatly in a back-grinding is not added, the simplification of the process of a back-grinding step is possible.

In the above-mentioned back-grinding, although semiconductor wafer 1 was made thin till predetermined thickness (fourth thickness), and second crushing layer 5 was further formed on the back surface of semiconductor wafer 1 by grinding the back surface of semiconductor wafer 1 one by one using three abrasives of the first abrasive (fineness number of an abrasive particle, for example, from #320 to #360), the second abrasive (fineness number of an abrasive particle, for example, from #1500 to #2000), and the third abrasive (fineness number of an abrasive particle, for example, from #3000 to #100000), the back surface of semiconductor wafer 1 can also be ground one by one using, for example, two abrasives, first abrasive (fineness number of an abrasive particle, for example, from #320 to #360), and third abrasive (fineness number of an abrasive particle, for example, from #3000 to #100000). Hereby, the simplification of the process of a back-grinding step is still more possible. The back-grinding which used two abrasives, the first abrasive (fineness number of an abrasive particle for example, from #320 to #360) and the third abrasive (fineness number of an abrasive particle, for example, from #3000 to #100000), for below is explained.

First, by performing rough grinding the back surface of semiconductor wafer 1 like the rough grinding which was mentioned above, and which used first abrasive 3, the thickness of semiconductor wafer 1 is made to decrease till predetermined thickness (second thickness).

Then, the back surface of semiconductor wafer 1 is performed fine finish grinding. By performing fine finish grinding pressing the rotating third abrasive at the back surface of semiconductor wafer 1, after making vacuum adsorption of the circuit formation surface of semiconductor wafer 1 to a chuck table here using the same grinder apparatus as the FIG. 2, the thickness of semiconductor wafer 1 is made to decrease till predetermined thickness (fourth thickness). Since finish grinding using the second abrasive (fineness number of an abrasive particle, for example, from #1500 to #2000) mentioned above is not performed, by this fine finish grinding, semiconductor wafer 1 is ground by, for example, 25-40 μm, and the fourth thickness of semiconductor wafer 1 becomes less than 100 μm, less than 80 μm, or less than 60 μm, for example. Second crushing layer 5 of the thickness of, for example, less than 0.5 μm, less than 0.3 μm, or less than 0.1 μm is formed on the back surface of semiconductor wafer 1. Also in fine finish grinding here, the diamond wheel mentioned above, that is, the diamond wheel which held the diamond abrasive with vitrified binder B1 which has countless bubbles and impregnated synthetic-resin B2 in the countless bubbles of vitrified binder B1 is used as the third abrasive.

Next, each step after forming the second crushing layer in the back surface of semiconductor wafer 1 by the back-grinding is explained in order further.

Figure 9A:
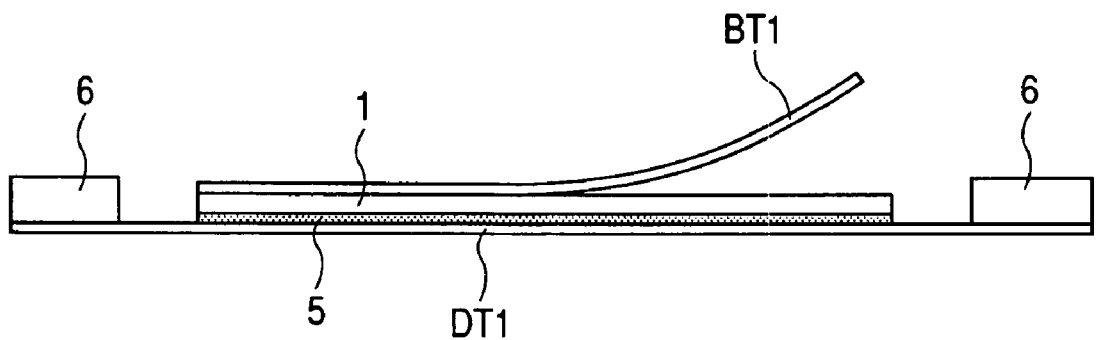
FIGS. 9A and 9B are principal part side views in the manufacturing process of the semiconductor integrated circuit device following FIG. 2.
Figure 9B:
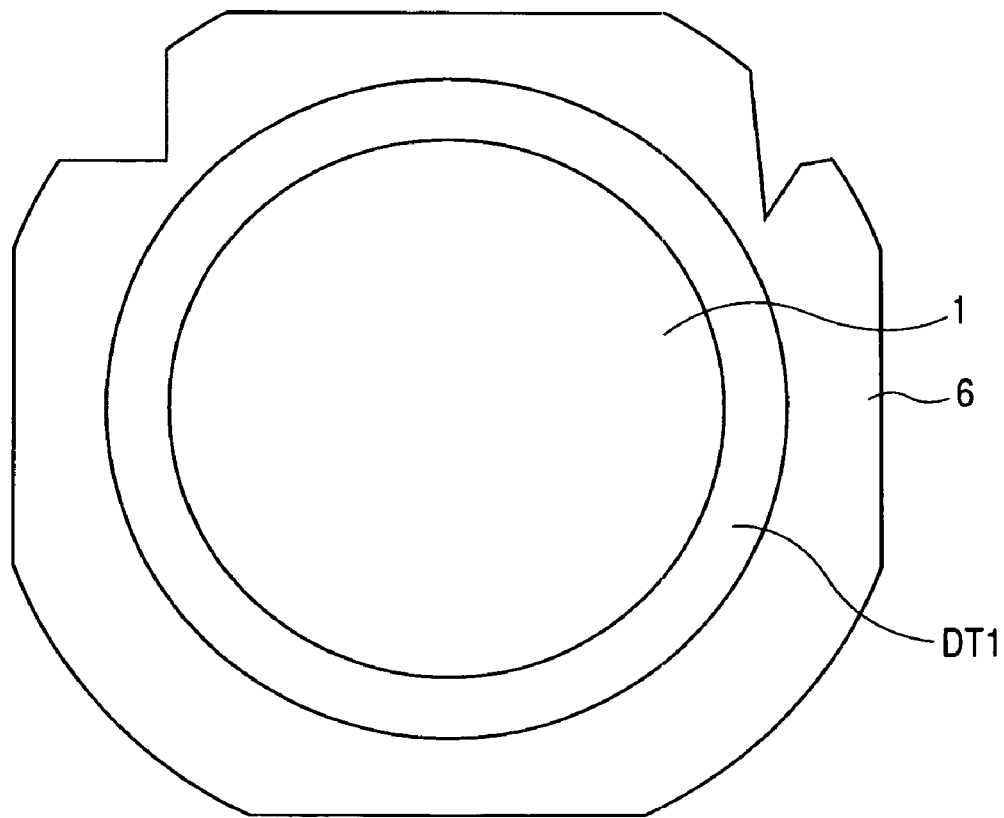

After washing and drying semiconductor wafer 1 (washing and drying step P5 of FIG. 1), as shown in FIGS. 9A and 9B, semiconductor wafer 1 is stuck on dicing tape DT1 again (wafer mounting step P6 of FIG. 1). First, vacuum adsorption of the semiconductor wafer 1 is made by a wafer transport jig, and it transports to a wafer mounting device as it is. Semiconductor wafer 1 transported by the wafer mounting device is sent to an alignment part, alignment of a notch or an orientation-flat is performed, after that, semiconductor wafer 1 is sent to a wafer mount part, and wafer mounting is performed. In wafer mounting, annular frame 6 which stuck dicing tape DT1 beforehand is prepared, and semiconductor wafer 1 is stuck on this dicing tape DT1, making the circuit formation surface the upper surface. Dicing tape DT1 uses polyolefine as a base, for example, an acrylic system UV cure type adhesive is applied, and the release material which includes polyester is further stuck on it. A release material is a mold-releasing paper, for example, a release material is removed and dicing tape DT1 is stuck on semiconductor wafer 1. The thickness of dicing tape DT1 is 90 μm, for example, and adhesion is, for example, 200 g/25 mm before UV irradiation, and 10 to 20 g/25 mm after UV irradiation. The dicing tape which did mold-releasing-processing the back surface of the substrate may be used without release material.

Subsequently, frame 6 equipped with semiconductor wafer 1 is sent to an adhesive tape stripping part. Here, adhesive tape BT1 is peeled from semiconductor wafer 1. Thus, the reason of resticking semiconductor wafer 1 on frame 6 is that it is necessary to use as the upper surface the circuit formation surface in which the alignment mark is formed in order to perform dicing on the basis of the alignment mark which is formed in the circuit formation surface of semiconductor wafer 1 at a later dicing step. Since semiconductor wafer 1 is fixed via dicing tape DT1 stuck on frame 6 even if adhesive tape BT1 is peeled, a warp of semiconductor wafer 1 does not surface.

Figure 10:
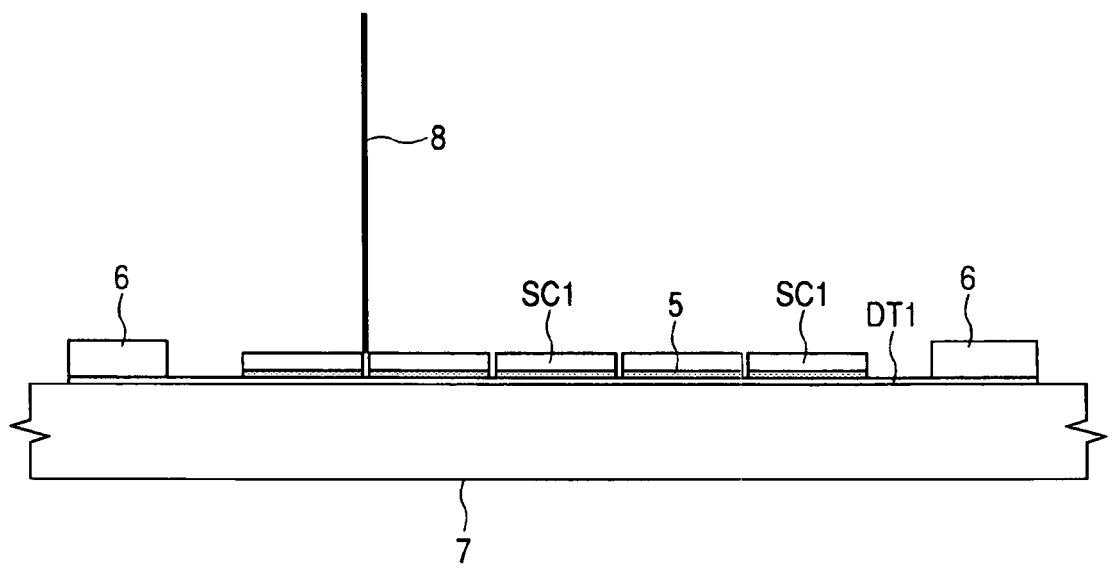
FIG. 10 is a principal part side view in the manufacturing process of the semiconductor integrated circuit device following FIG. 9.

Next, as shown in FIG. 10, dicing of the semiconductor wafer 1 is made (dicing step P7 of FIG. 1). Although semiconductor wafer 1 is individually separated into chip SC1, since respective-chip SC1 is being fixed to frame 6 via dicing tape DT1 even after individually separating, the state where it aligned is maintained. First, vacuum adsorption of the circuit formation surface of semiconductor wafer 1 is made by a wafer transport jig, it transports to a dicing apparatus as it is, and semiconductor wafer 1 is laid on dicing table 7. Then, semiconductor wafer 1 is cut vertically and horizontally along a scribe-line using ultra thin circular blade 8 which is called a diamond saw and which stuck the diamond particle (The method using a laser may be used for division of a wafer. In that case, there is an additional merit, such as making a width of cut very small).

Figure 11:
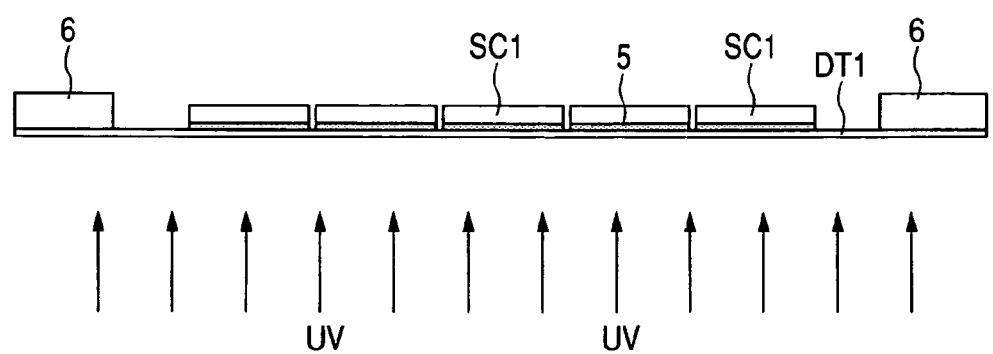
FIG. 11 is a principal part side view in the manufacturing process of the semiconductor integrated circuit device following FIG. 10.

Next, as shown in FIG. 11, semiconductor wafer 1 is irradiated with UV (UV irradiation step P8 of FIG. 1). UV is irradiated from the back surface side of dicing tape DT1, and the adhesion of the surface of dicing tape DT1 which touches respective-chips SC1 is reduced, for example to about 10-20 g/25 mm. Hereby, respective-chip SC1 separates easily from dicing tape DT1.

Figure 12:
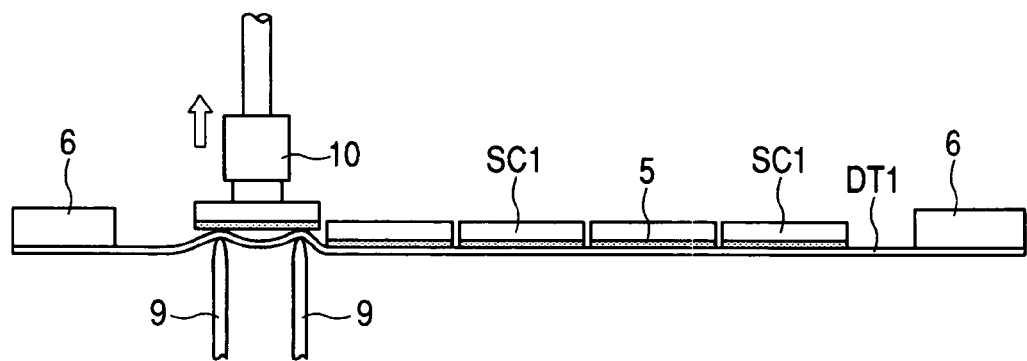
FIG. 12 is a principal part side view in the manufacturing process of the semiconductor integrated circuit device following FIG. 11.

Next, as shown in FIG. 12, chip SC1 judged to be good in wafer test process P2 of FIG. 1 is picked up (picking-up step P9 of FIG. 1). First, the back surface of chip SC1 is pushed and pressed via dicing tape DT1 by pushing-up pin 9, and this peels chip SC1 from dicing tape DT1. Then, one chip SC1 is torn off and picked up at a time from dicing tape DT1 by collet 10 moving and being located in the upper part which faces pushing-up pin 9, and by making vacuum adsorption of the circuit formation surface of chip SC1 which is peeled with collet 10. Since the adhesive strength of dicing tape DT1 and chip SC1 can be weakening by UV irradiation, even if it is chip SC1 which is thin and with which strength is falling, it can be picked up surely. Collet 10 has a contour of a nearly tubular type, for example, and the adsorption part located in the bottom includes elastic synthetic rubber etc., for example.

Figure 13:
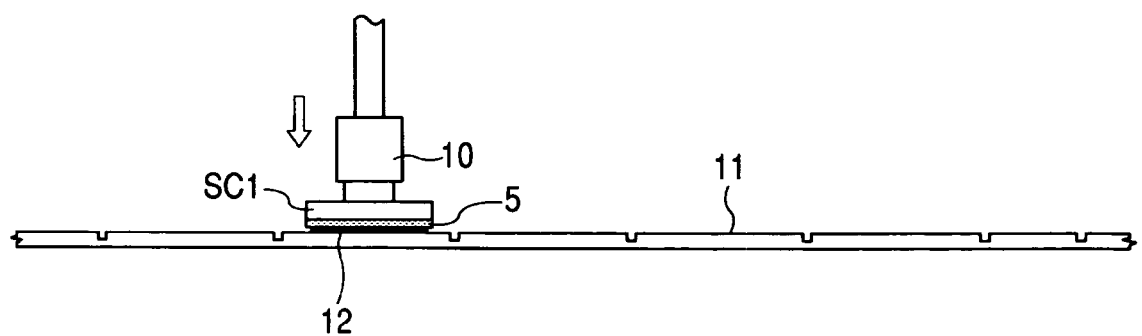
FIG. 13 is a principal part side view in the manufacturing process of the semiconductor integrated circuit device following FIG. 12.

Next, as shown in FIG. 13, chip SC1 used as the first stage is mounted on substrate 11 (die-bonding step P10 of FIG. 1). First, chip SC1 picked up is adsorbed and held by collet 10, and it is transported in the specified position on substrate 11. Then, paste material 12 is carried on the plated island of substrate 11 (chip mounting region), chip SC1 is forced here lightly, and curing treatment is performed at the temperature about 100 to 200° C. This sticks chip SC1 on substrate 11. As paste material 12, epoxy system resin, polyimide system resin, acrylic system resin, or silicone system resin can be exemplified. Besides attachment by paste material 12, adhering by rubbing the back surface of chip SC1 against the plated island lightly, or inserting a bit of a gold tape between the plated island and chip SC1 and making eutectic crystal of gold and silicon may be fine.

After die bonding of the excellent article chip stuck on dicing tape DT1 and removal of a defective chip are completed, dicing tape DT1 is removed from frame 6, and frame 6 is recycled.

Figure 14:
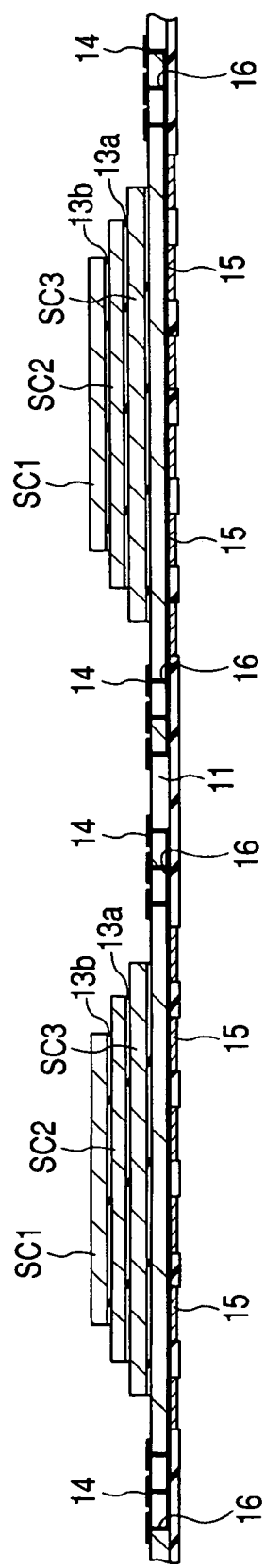
FIG. 14 is a principal part side view in the manufacturing process of the semiconductor integrated circuit device following FIG. 13.

Next, as shown in FIG. 14, by preparing chip SC2 like the chip SC1 and joining chip SC2 which becomes the second stage on chip SC1 of the first stage using, for example, insulating paste 13a, then, by preparing chip SC3 like the chip SC1 and joining chip SC3 which becomes the third stage on chip SC2 of the second stage using, for example, insulating paste 13b, chips SC1, SC2, and SC3 are laminated. As chip SC1 of the first stage, a microcomputer can be exemplified, for example, as chip SC2 of the second stage, for example, electrically batch erasing type EEPROM (Electrically Erasable Programmable Read Only Memory) can be exemplified, and SRAM can be exemplified as chip SC3 of the third stage, for example. A plurality of electrode pads 14 are formed on the front surface of this substrate 11, a plurality of connection pads 15 are formed on the back surface, and both are electrically connected by wiring 16 in a substrate.

Figure 15:
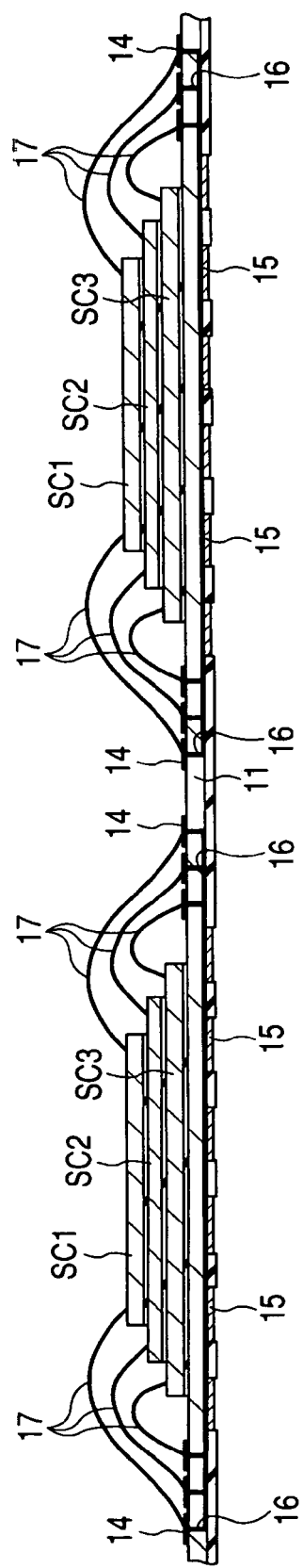
FIG. 15 is a principal part side view in the manufacturing process of the semiconductor integrated circuit device following FIG. 14.

Next, as shown in FIG. 15, the bonding pad arranged on the border of the front surface of each chip SC1, SC2, or SC3 and electrode pad 14 of the front surface of substrate 11 are connected using bonding wire 17 (wire bonding step P11 of FIG. 1). The operation is automated and done using a bonding device. The arrangement information of the bonding pad of stacked chips SC1, SC2, and SC3 and electrode pad 14 of the front surface of substrate 11 is beforehand inputted into the bonding device. The relative location relation between stacked chips SC1, SC2, and SC3 mounted on substrate 11, the bonding pad of the front surface, and electrode pad 14 of the front surface of substrate 11 is incorporated as an image, data processing is performed, and bonding wire 17 is connected correctly. On this occasion, the loop shape of bonding wire 17 is controlled to the form which rose to be unable to touch the periphery of stacked chips SC1, SC2, and SC3.

Figure 16:
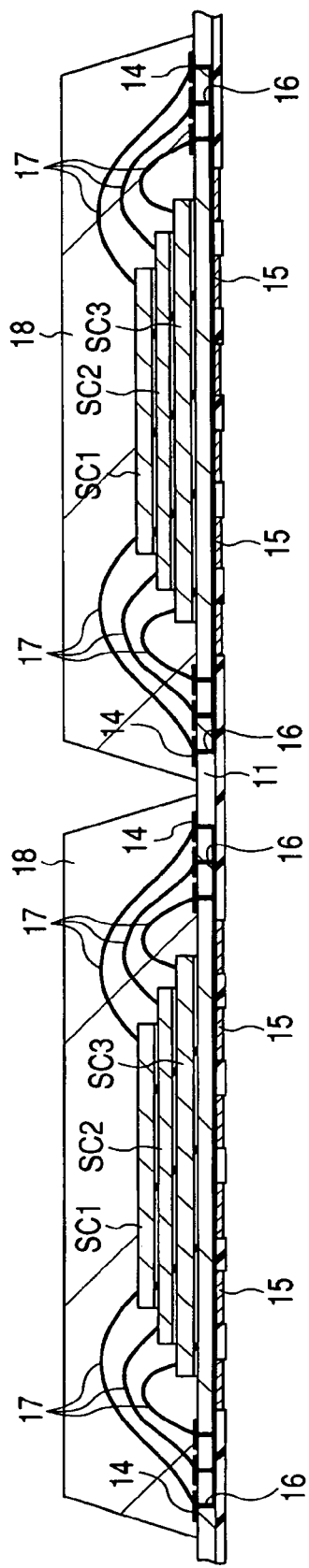
FIG. 16 is a principal part side view in the manufacturing process of the semiconductor integrated circuit device following FIG. 15.

Next, as shown in FIG. 16, substrate 11 to which bonding wire 17 was connected is set to a metallic molding machine, resin 18 which raised temperature and liquefied is pressurized and sent and poured in, the stacked chips SC1, SC2, and SC3 are enclosed and mold forming is made (molding step 12 of FIG. 1). Then, excessive resin 18 or an excessive burr is removed.

Figure 17:
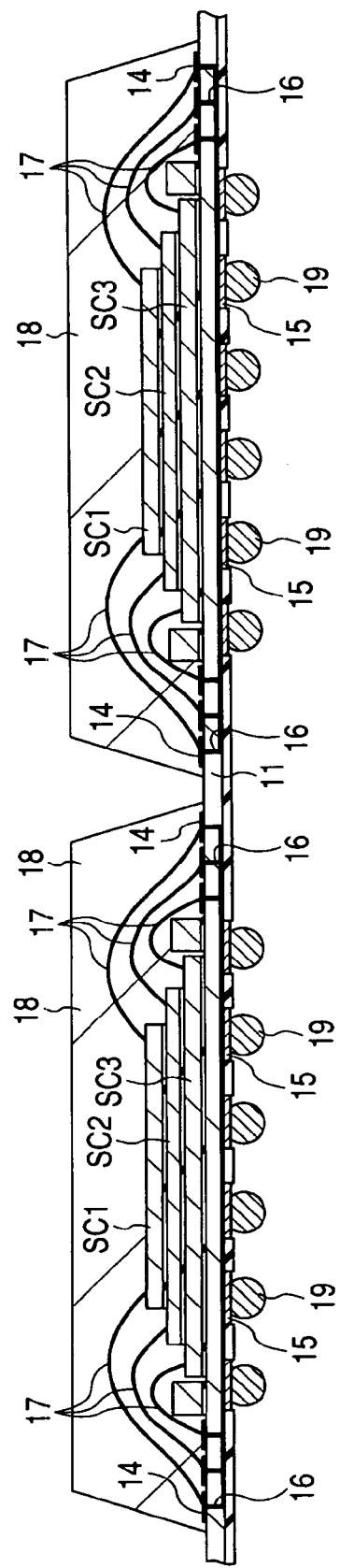
FIG. 17 is a principal part side view in the manufacturing process of the semiconductor integrated circuit device following FIG. 16.

Next, after supplying bump 19 which includes, for example, solder to connection pad 15 of the back surface of substrate 11 as shown in FIG. 17, reflow treatment is performed, bump 19 is melted and bump 19 and connection pad 15 are connected (bump forming step P13 of FIG. 1).

Then, as shown in FIG. 18, on resin 18, a name of article etc. is sealed and each stacked chip SC1, SC2, and SC3 is carved from substrate 11 (cutting step P14 of FIG. 1). Then, sorting out the product which includes finished each stacked chip SC1, SC2, and SC3 in accordance with product quality standards, and passing testing step, the product is completed (assembling step P15 of FIG. 1).

Next, an example which is Embodiment 1 and which makes consecutive processing of from a back-grinding (step P4 of FIG. 1) to the wafer mounting (step P6 of FIG. 1) is explained using explanatory drawing of consistent processing equipment shown in FIG. 19.

Consistent processing-equipment BGM1 shown in FIG. 19 includes a back grinder part, a washing part, and a wafer mount part. Each part is equipped with loader 20 which carries in semiconductor wafer 1, and unloader 21 to carry out, and each part can also be used as a stand-alone. Between the back grinder part and the washing part, transport robot 22 which transports semiconductor wafer 1 is equipped between both, and transport robot 23 which transports semiconductor wafer 1 between both is similarly equipped between the washing part and the wafer mount part.

First, after putting a FOUP carrying a plurality of semiconductor wafers 1 on loader 20 of the back grinder part, semiconductor wafer 1 of one sheet is picked out from the FOUP with transport robot 24, and it carries in to processing chamber R1 of the back grinder part. A FOUP is a sealing storing container for batch transportation of semiconductor wafer 1, and usually stores semiconductor wafer 1 in batch units, such as 25 sheets, 12 sheets, and 6 sheets etc. The container outer wall of a FOUP has a sealed structure except for the fine ventilation filter part, and dust is eliminated nearly thoroughly. Therefore, even if it transports in the atmosphere of class 1000, the inside can be maintained the cleanliness factor of class 1. When the robot at the side of the apparatus draws the door of the FOUP in the inside of the apparatus, docking to the apparatus is performed where cleanliness is held.

Next, after laying semiconductor wafer 1 on chuck table 25 and making vacuum adsorption, performing rough grinding the back surface of semiconductor wafer 1 using the first abrasive, the thickness of semiconductor wafer 1 is made to decrease till predetermined thickness (second thickness). Then, performing finish grinding the back surface of semiconductor wafer 1 using the second abrasive, the thickness of semiconductor wafer 1 is made to decrease till predetermined thickness (third thickness). Then, performing fine finish grinding the back surface of semiconductor wafer 1 using the third abrasive, the thickness of semiconductor wafer 1 is made to decrease till predetermined thickness (fourth thickness) and second crushing layer 5 is further formed on the back surface of semiconductor wafer 1. Here, although grinding which used the first, the second and the third abrasive was performed, the finish grinding using the second abrasive may be omitted.

Next, after the back-grinding of semiconductor wafer 1 finishes, semiconductor wafer 1 is carried out from the back grinder part with transport robot 22, and transported to a washing part. Furthermore, semiconductor wafer 1 is carried in to processing chamber R2 of washing equipment with transport robot 26, and washing by pure water and drying of semiconductor wafer 1 are performed. Then, after carrying out semiconductor wafer 1 from the washing part with transport robot 23, transporting to a wafer mount part and making vacuum adsorption of the back surface of semiconductor wafer 1 with transport robot 27, the vacuum adsorption surface of semiconductor wafer 1 is changed, and vacuum adsorption of the circuit formation surface is made. Then, semiconductor wafer 1 is carried in to processing chamber R3 of the wafer mount part. Here, after making the circuit formation surface the upper surface and sticking semiconductor wafer 1 on the dicing tape stuck and fixed to the annular frame, adhesive tape BT1 is peeled. Then, semiconductor wafer 1 is transported to unloader 21 of the wafer mount part, semiconductor wafer 1 is taken out from the wafer mount part, and it returns to a FOUP again.

Thus, semiconductor wafer 1 can be processed from back-grinding to wafer mounting by using consistent processing-equipment BGM1 in a short time.

According to Embodiment 1, in the fine finish grinding which is the last process of the back-grinding, by using the diamond wheel which held the diamond abrasive with vitrified binder B1 which has countless bubbles and impregnated synthetic-resin B-2 in the countless bubbles of vitrified binder B1 as the third abrasive, unusual polishing (For example, the polishing blemish and polishing line which happen at the back surface of semiconductor wafer 1, or the stoppage of a revolution of a diamond wheel by the load applied to the spindle motor of the grinder apparatus etc.) of the back surface of semiconductor wafer 1 can be prevented. By this, the thickness of semiconductor wafer 1 is ground to, for example less than 100 μm, less than 80 μm or less than 60 μm, and relatively thin second crushing layer 5, for example, second crushing layer 5 of the thickness of less than 0.5 μm, less than 0.3 μm, or less than 0.1 μm, can be formed on the back surface of semiconductor wafer 1. As a result, without reducing the die strength of a chip, infiltration of the contamination impurities from the back surface of semiconductor wafer 1 can be prevented simultaneously, and the characteristic defect of the semiconductor element resulting from contamination impurities can be prevented. Lowering of the manufacturing yield of semiconductor products can be suppressed.

Embodiment 2

In Embodiment 1 of the present invention mentioned above, although the diamond wheel which held the diamond abrasive with vitrified binder B1 which has countless bubbles and impregnated synthetic-resin B2 in the countless bubbles of vitrified binder B1 was used as the third abrasive in the fine finish grinding of the back surface of semiconductor wafer 1, in Embodiment 2 of the present invention, the diamond wheel which formed a plurality of holes in the vitrified binder holding the diamond abrasive, and impregnated the synthetic resin inside the holes is used as the third abrasive.

Figure 20A:
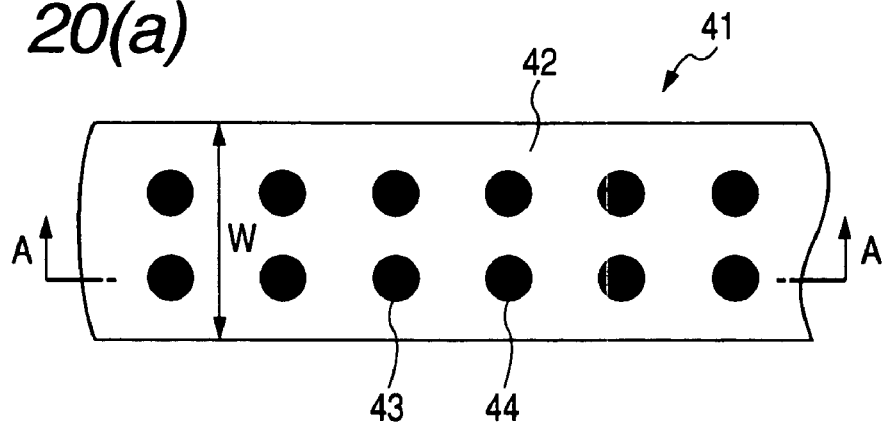
FIGS. 20A and 20B are a principal part top view and a principal part cross-sectional view of the diamond wheel by Embodiment 2 of the present invention.
Figure 20B:
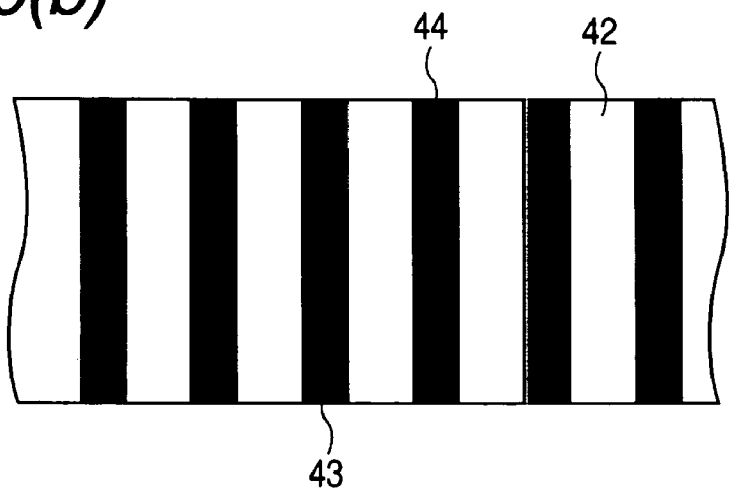

The principal part top view, and the principal part cross-sectional view in an A-A line of FIG. 20A of a diamond wheel which is Embodiment 2 of the present invention, respectively are shown in FIGS. 20A and 20B.

The third abrasive is the so-called grinding wheel that has fixed abrasive like Embodiment 1 mentioned above. As for the fineness number of the fixed abrasive of the third abrasive, #3000 to #100000 is considered to be the suitable range, for example (it cannot be overemphasized that it is not limited to this range depending on another conditions). Although #4000 to #50000 can be considered as range suitable for mass production, it is thought that the range of #5000 to #20000 is still more preferred. In Embodiment 2, the perimeter range which makes #8000 a central value, for example is used, the lower limit of the fineness number of the fixed abrasive of this third abrasive is decided in consideration of the die strength of a chip, and the upper limit is decided in consideration of the gettering effect. A plurality of fine abrasive particles, for example, a diamond abrasive, are hardened and used with the binder.

In Embodiment 2, basal part 42 of diamond wheel 41 is formed, holding diamond abrasives with a vitrified binder. Width w of the basal part 42 is about 3 to 4 mm, for example. Diamond wheel 41 is formed, forming a plurality of holes 43 in the basal part 42 and making impregnation of the synthetic resins (for example, epoxy system resin, urethane system resin, phenol system resin, polyimide system resin, etc.) 44 to the inside of each hole 43.

When diamond wheel 41 is formed only from basal part 42 which held the diamond abrasive with the vitrified binder, originating in vitrifide being hard, a load will be applied to the spindle motor of the grinder apparatus, and the trouble of the revolution of diamond wheel 41 stopping will occur. However, by forming a plurality of holes 43 in basal part 42 which held the diamond abrasive by vitrifide, and impregnating synthetic resin 44 which has viscosity and is weaker than vitrifide in strength inside this hole 43, diamond wheel 41 which has no unusual falling and has moderate hardness can be formed. Although a plurality of holes 43 penetrated from the grinding surface of diamond wheel 41 to the surface (back surface) of another side are exemplified in FIG. 20B, it is not necessary to make hole 43 penetrate.

Arrangement of hole 43, the diameter of hole 43, and the adjoining distance of hole 43 and hole 43 are determined in consideration of the brittleness and hardness of diamond wheel 41. As for the diameter of hole 43, as a representative example, 0.1 to 1 mm is considered to be the suitable range, for example (it cannot be overemphasized that it is not limited to this range depending on another conditions). Although 0.2 to 0.8 mm can be considered as range suitable for mass production, the perimeter range which makes 0.5 mm a central value is considered to be the most suitable, further. As for the distance of adjoining hole 43 and hole 43, 0.1 to 3 mm is considered to be the suitable range, for example (it cannot be overemphasized that it is not limited to this range depending on another conditions). Although 0.5 to 2 mm can be considered as range suitable for mass production, the perimeter range which makes 1 mm a central value is considered to be the most suitable, further.

According to Embodiment 2, in the fine finish grinding which is the last process of a back-grinding, by using diamond wheel 41 which formed a plurality of holes 43 in the vitrified binder holding a diamond abrasive, and impregnated synthetic resin 44 inside the holes 43 as the third abrasive, unusual polishing (For example, the polishing blemish and polishing line which happen at the back surface of semiconductor wafer 1, or the stoppage of a revolution of a diamond wheel by the load applied to the spindle motor of the grinder apparatus etc.) of the back surface of semiconductor wafer 1 can be prevented. Hereby, the same effect as Embodiment 1 mentioned above is acquired.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, in the embodiment, although the diamond is exemplified as fixed abrasive, it is not limited to this and the fixed abrasive which makes alumina a main matter can be applied.

The present invention is performed after the preceding process which forms a circuit pattern on a semiconductor wafer and tests a chip one by one, and can be applied to the back process which assembles a chip for a product.

What is claimed is:

1. A manufacturing method of a semiconductor integrated circuit device, comprising the steps of:
   (a) forming a circuit pattern over a first main surface of a semiconductor wafer which has a first thickness;
   (b) making the semiconductor wafer a second thickness, grinding a second main surface of the semiconductor wafer using a first abrasive which has fixed abrasive;
   (c) making the semiconductor wafer a third thickness, and forming a crushing layer in the second main surface of the semiconductor wafer, grinding the second main surface of the semiconductor wafer using a second abrasive which has a fixed abrasive whose particle diameter is smaller than the first abrasive; and
   (d) individually separating the semiconductor wafer into a chip, performing dicing of the semiconductor wafer;
   wherein the second abrasive is a grinding wheel which held fixed abrasive with a binder which has countless bubbles, and which includes porcelain nature, and impregnates a synthetic resin in the countless bubbles, and
   wherein the porcelain nature is a material which has feldspar as a main component.

2. A manufacturing method of a semiconductor integrated circuit device according to claim 1, wherein
   the porcelain nature, having feldspar as a main component, is a material which mixed clay.

3. A manufacturing method of a semiconductor integrated circuit device according to claim 1, wherein
   the porcelain nature is vitrified.

4. A manufacturing method of a semiconductor integrated circuit device according to claim 1, wherein
   a fineness number of the fixed abrasive of the second abrasive is #4000 to #50000.

5. A manufacturing method of a semiconductor integrated circuit device according to claim 1, wherein
   a fineness number of the fixed abrasive of the second abrasive is #5000 to #20000.

6. A manufacturing method of a semiconductor integrated circuit device according to claim 1, wherein
   a fineness number of the fixed abrasive of the second abrasive is perimeter range which makes #8000 a central value.

7. A manufacturing method of a semiconductor integrated circuit device according to claim 1, wherein
   the synthetic resin is one of epoxy system resin, urethane system resin, phenol system resin, and polyimide system resin.

8. A manufacturing method of a semiconductor integrated circuit device according to claim 1, wherein
   the fixed abrasive of the second abrasive is a diamond abrasive.

9. A manufacturing method of a semiconductor integrated circuit device according to claim 1, between the step (b) and the step (c), further comprising a step of:
   (e) making the semiconductor wafer a fourth thickness thinner than the second thickness and thicker than the third thickness, grinding the second main surface of the semiconductor wafer using a third abrasive which has fixed abrasive with particle diameter smaller than the first abrasive and larger than the second abrasive.

10. A manufacturing method of a semiconductor integrated circuit device, comprising the steps of:
(a) forming a circuit pattern over a first main surface of a semiconductor wafer which has a first thickness;
(b) making the semiconductor wafer a second thickness, grinding a second main surface of the semiconductor wafer using a first abrasive which has fixed abrasive;
(c) making the semiconductor wafer a third thickness, and forming a crushing layer in the second main surface of the semiconductor wafer, grinding the second main surface of the semiconductor wafer using a second abrasive which has a fixed abrasive whose particle diameter is smaller than the first abrasive; and
(d) individually separating the semiconductor wafer into a chip, performing dicing of the semiconductor wafer;
wherein the second abrasive is a grinding wheel which holds fixed abrasive with a binder which includes porcelain nature, and impregnates a synthetic resin inside a plurality of holes formed in the porcelain nature, and
wherein the porcelain nature is a material which has feldspar as a main component.

11. A manufacturing method of a semiconductor integrated circuit device according to claim 10, wherein
the porcelain nature, having feldspar as a main component, is a material which mixed clay.

12. A manufacturing method of a semiconductor integrated circuit device according to claim 10, wherein
the porcelain nature is vitrified.

13. A manufacturing method of a semiconductor integrated circuit device according to claim 10, wherein
a fineness number of the fixed abrasive of the second abrasive is #4000 to #50000.

14. A manufacturing method of a semiconductor integrated circuit device according to claim 10, wherein
a fineness number of the fixed abrasive of the second abrasive is #5000 to #20000.

15. A manufacturing method of a semiconductor integrated circuit device according to claim 10, wherein
a fineness number of the fixed abrasive of the second abrasive is perimeter range which makes #8000 a central value.

16. A manufacturing method of a semiconductor integrated circuit device according to claim 10, wherein
the synthetic resin is one of epoxy system resin, urethane system resin, phenol system resin, and polyimide system resin.

17. A manufacturing method of a semiconductor integrated circuit device according to claim 10, wherein
the fixed abrasive of the second abrasive is a diamond abrasive.

18. A manufacturing method of a semiconductor integrated circuit device according to claim 10, wherein
the holes are penetrated from a grinding surface of the grinding wheel to a back surface.

19. A manufacturing method of a semiconductor integrated circuit device according to claim 10, between the step (b) and the step (c), further comprising a step of:
(e) making the semiconductor wafer a fourth thickness thinner than the second thickness and thicker than the third thickness, grinding the second main surface of the semiconductor wafer using a third abrasive which has fixed abrasive with particle diameter smaller than the first abrasive and larger than the second abrasive.

20. A manufacturing method of a semiconductor integrated circuit device, comprising the steps of:
(a) forming a circuit pattern over a first main surface of a semiconductor wafer which has a first thickness;
(b) making the semiconductor wafer a second thickness, grinding a second main surface of the semiconductor wafer using a first abrasive which has fixed abrasive;
(c) making the semiconductor wafer a third thickness, and forming a crushing layer in the second main surface of the semiconductor wafer, grinding the second main surface of the semiconductor wafer using a second abrasive which has a fixed abrasive whose particle diameter is smaller than the first abrasive; and
(d) individually separating the semiconductor wafer into a chip, performing dicing of the semiconductor wafer;
wherein the second abrasive is a grinding wheel which held fixed abrasive with a binder which has countless bubbles, and which includes porcelain nature, and impregnates a synthetic resin in the countless bubbles; and
wherein between the step (b) and the step (c), the method further comprises the step of:
(e) making the semiconductor wafer a fourth thickness thinner than the second thickness and thicker than the third thickness, grinding the second main surface of the semiconductor wafer using a third abrasive which has fixed abrasive with particle diameter smaller than the first abrasive and larger than the second abrasive.

21. A manufacturing method of a semiconductor integrated circuit device, comprising the steps of:
(a) forming a circuit pattern over a first main surface of a semiconductor wafer which has a first thickness;
(b) making the semiconductor wafer a second thickness, grinding a second main surface of the semiconductor wafer using a first abrasive which has fixed abrasive;
(c) making the semiconductor wafer a third thickness, and forming a crushing layer in the second main surface of the semiconductor wafer, grinding the second main surface of the semiconductor wafer using a second abrasive which has a fixed abrasive whose particle diameter is smaller than the first abrasive; and
(d) individually separating the semiconductor wafer into a chip, performing dicing of the semiconductor wafer;
wherein the second abrasive is a grinding wheel which holds fixed abrasive with a binder which includes porcelain nature, and impregnates a synthetic resin inside a plurality of holes formed in the porcelain nature, and
wherein the holes are penetrated from a grinding surface of the grinding wheel to a back surface.

22. A manufacturing method of a semiconductor integrated circuit device, comprising the steps of:
(a) forming a circuit pattern over a first main surface of a semiconductor wafer which has a first thickness;
(b) making the semiconductor wafer a second thickness, grinding a second main surface of the semiconductor wafer using a first abrasive which has fixed abrasive;
(c) making the semiconductor wafer a third thickness, and forming a crushing layer in the second main surface of the semiconductor wafer, grinding the second main surface of the semiconductor wafer using a second abrasive which has a fixed abrasive whose particle diameter is smaller than the first abrasive; and
(d) individually separating the semiconductor wafer into a chip, performing dicing of the semiconductor wafer;
wherein the second abrasive is a grinding wheel which holds fixed abrasive with a binder which includes porcelain nature, and impregnates a synthetic resin inside a plurality of holes formed in the porcelain nature, and wherein the method further includes, between the steps (b) and (c), the step of:

(e) making the semiconductor wafer a fourth thickness thinner than the second thickness and thicker than the third thickness, grinding the second main surface of the semiconductor wafer using a third abrasive which has fixed abrasive with particle diameter smaller than the first abrasive and larger than the second abrasive.

* * * * *